(12) United States Patent
Suzuki

(10) Patent No.: US 7,123,347 B2
(45) Date of Patent: Oct. 17, 2006

(54) IMAGE FORMATION CHARACTERISTICS ADJUSTMENT METHOD FOR PROJECTION OPTICAL SYSTEM

(75) Inventor: Kousuke Suzuki, Shinagawa-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/713,269

(22) Filed: Nov. 17, 2003

(65) Prior Publication Data

US 2004/0105085 A1    Jun. 3, 2004

Related U.S. Application Data

(63) Continuation of application No. 09/787,364, filed as application No. PCT/JP99/04989 on Sep. 13, 1999, now abandoned.

(30) Foreign Application Priority Data

Sep. 17, 1998    (JP) ................................. 10-262802

(51) Int. Cl.
*G03B 27/54*    (2006.01)
*G03B 27/72*    (2006.01)
*G03B 27/42*    (2006.01)

(52) U.S. Cl. .............................. 355/67; 355/69; 355/53
(58) Field of Classification Search ................. 355/69, 355/53, 55, 67, 52, 77, 71; 359/432, 821; 372/20; 382/144; 438/7, 16
See application file for complete search history.

(56) References Cited

U.S. PATENT DOCUMENTS 5,838,426 A    11/1998    Shinonaga et al.

FOREIGN PATENT DOCUMENTS

| JP | A 1-309323 | 12/1989 |
| JP | A 7-192990 | 7/1995 |
| JP | A 7-245251 | 9/1995 |
| JP | A 8-305034 | 11/1996 |
| JP | A 9-199403 | 7/1997 |

*Primary Examiner*—Peter B. Kim
(74) *Attorney, Agent, or Firm*—Oliff & Berridge, PLC

(57) ABSTRACT

The present invention is an adjustment method for a projection optical system which allows measuring the relationship (dependency) of the fluctuation amount of the image formation characteristics of the projection optical system with respect to the change of the installation environment (e.g. barometric pressure) around the projection optical system substantially, without actually changing the installation environment. The illumination light (IL) from the exposure light source (1) illuminates the reticle (9) via the fly eye lenses (2, 4) and the capacitor lens (8) etc., and the pattern image on the reticle (9) is projected onto the wafer (12) via the projection optical system (11) under the illumination light (IL). Based on the fact that changing the wavelength of the illumination light (IL) and changing the barometric pressure (approximately equal to the atmospheric pressure) are substantially equivalent for the projection optical system (11), the fluctuation amount of the image formation characteristics is measured while changing the wavelength of the illumination light (IL) so as to measure the dependency of the image formation characteristics on the atmospheric pressure.

33 Claims, 7 Drawing Sheets

IMAGE FORMATION CHARACTERISTICS ADJUSTMENT METHOD FOR PROJECTION OPTICAL SYSTEM

This is a Continuation of application Ser. No. 09/787,364 filed May 29, 2001, now abandoned which in turn is a National Stage of PCT/JP99/04989 filed Sep. 13, 1999. The entire disclosures of the prior application is hereby incorporated by reference herein in its entirety.

TECHNICAL FIELD

The present invention relates to an adjustment method for a projection optical system which projects an image of a predetermined pattern, and is suitable for adjusting a projection optical system of a projection exposure apparatus which is used for transferring a mask pattern onto such a substrate as a wafer to fabricate devices, such as a semiconductor device, an image sensing device (e.g. CCD), a liquid crystal display element, or a thin film magnetic head.

BACKGROUND ART

In a stepper type or step-and-scan type projection exposure apparatus which is used for transferring an image of a pattern of a reticle used as a mask onto a wafer (or a glass plate) used as a substrate via the projection optical system when a semiconductor device is fabricated, exposure must be performed while constantly maintaining the image formation characteristics of the projection optical system in good status. This is why the projection exposure apparatus has been stored in a chamber where temperature and humidity are controlled and air from which particles are removed by a dust proof filter is circulating, and temperature and humidity around the projection optical system have been set to a predetermined status.

However, the barometric pressure of the air inside the chamber changes in association with the atmospheric pressure, so if the atmospheric pressure of the location where the projection exposure apparatus is operating changes, the barometric pressure of the air around the projection optical system and the air between lenses in the projection optical system changes, and the image formation characteristics of the projection optical system, such as the best focal position and the projection magnification, change slightly. If exposure is performed in the status where the image formation characteristics have changed in this way, the resolution of the image to be projected onto the wafer deteriorates, or an alignment error is generated. Therefore conventionally the relationship of the fluctuation amount of the image formation characteristics of the projection optical system with respect to the barometric pressure around the projection optical system (hereafter "atmospheric pressure dependency") is measured and stored in advance when the projection optical system is assembled and adjusted for example, and when the projection exposure apparatus is operating, the barometric pressure around the projection exposure apparatus, for example, is constantly measured, the fluctuation amount of the image formation characteristics of the projection optical system is determined based on the measurement result and the stored relationship, and the fluctuation amount of the image formation characteristics is corrected.

In order to measure the atmospheric pressure dependency of the image formation characteristics of the projection optical system, the barometric pressure around the projection optical system has been changed at assembly and adjustment in the following ways; (a) waits for the atmospheric pressure to gradually change over a long period of time, and (b) storing the projection optical system in a pressure chamber where internal barometric pressure can be changed to a desired value.

However, of these methods of changing the atmospheric pressure, method (a) of waiting for the atmospheric pressure to change takes a long period of time for assembly and adjustment, and method (b) of using a pressure chamber increases the cost of manufacturing equipment, so in both cases, it is difficult to apply one method to all or all kinds of projection optical systems. In the case of method (a), a desired atmospheric pressure change characteristic may not be obtained because the change of atmospheric pressure is subject to natural phenomena.

Recently, a huge projection optical system, such as a cata-dioptric system, is used to respond a shortening of the exposure wavelength and an increase of the numerical aperture. If method (b) is used for such a huge projection optical system, a large pressure chamber is required, and manufacturing cost further increases accordingly.

With the foregoing in view, it is a first object of the present invention to provide an adjustment method for a projection optical system which allows substantially to measure the relationship (dependency) of the fluctuation amount of the image formation characteristics of the projection optical system with respect to the change of the installation environment (e.g. barometric pressure) around the projection optical system, without actually changing the installation environment.

It is a second object of the present invention to provide an adjustment method for a projection optical system which allows to substantially adjust the projection optical system according to the installation environment (e.g. atmospheric pressure) of the installation location where the projection optical system is actually used for exposure without changing the installation environment of the assembly location where the projection optical system is assembled and adjusted, when the installation environment is different between the assembly location and the actual installation location (relocated location).

It is a third object of the present invention to provide an adjustment method for a projection optical system which allows to very accurately correct the change of the image formation characteristics of the projection optical system, which is generated due to a fluctuation of the installation environment.

It is a fourth object of the present invention to provide an exposure method using such an adjustment method, and a projection exposure apparatus which can execute the adjustment method. It is still another object of the present invention to provide a device fabrication method using such an exposure method.

DISCLOSURE OF THE INVENTION

The first adjustment method for a projection optical system according to the present invention is an adjustment method for a projection optical system (11) which projects an image of a pattern on a first surface onto a second surface, characterized in that the wavelength of the illumination light for illuminating the pattern on the first surface is changed, and the change amount of the image formation characteristics of the image projected onto the second surface via the projection optical system is detected.

The present invention uses the fact that changing the wavelength of the illumination light and changing a predetermined installation environment (e.g. pressure of ambient gas, temperature, humidity) of the projection optical system are substantially equivalent for the projection optical system. For example, barometric pressure around the projection optical system, that is, the pressure of gas around one or more refraction elements (e.g. lens) constituting the projection optical system, is assumed as the installation environment for the following description. If only one type of glass material is used for the refraction elements, the above mentioned equivalency is completely established, and even if there are a plurality of types of glass materials, the equivalency is approximately established.

With reference to FIG. 12, the equivalency will now be described. In FIG. 12, when the illumination light with wavelength $\lambda$ enters the lens 51 with refractive index nb, which constitutes the projection optical system, along the optical path 52, it is assumed that the pressure of the gas (barometric pressure) around the lens 51 is P, and the refractive index thereof is na. If the temperature and humidity of the gas are constant in this case, the refractive index na of the gas is represented by the function na $(\lambda, P)$ where $\lambda$ is the wavelength of the illumination light and P is the barometric pressure, and the refractive index nb of the lens 51 is represented by the function nb $(\lambda)$ where $\lambda$ is the wavelength. Therefore if the refractive indexes na and nb, when the wavelength $\lambda$ and the barometric pressure P are the initial values $\lambda_0$ and $P_0$ respectively, are $na_0$ and $nb_0$ respectively, then the refractive indexes na and nb when the wavelength $\lambda$ and barometric pressure P changed for $\Delta\lambda$ and $\Delta P$ respectively are represented as follows using predetermined coefficients K1, k2 and k3 based on linear approximation.

$$na \approx na_0 + k1 \cdot \Delta\lambda + k2 \cdot \Delta P \quad (A1)$$

$$nb \approx nb_0 + k3 \cdot \Delta\lambda \quad (A2)$$

In FIG. 12, the optical path of the illumination light is uniformly determined by the relative refractive index nb/na (=nr) with respect to the gas around the lens 51. Therefore if only the barometric pressure P changes for $\Delta P$ from the initial status ($\lambda=\lambda_0$, $P=P_0$) and the relative refractive index nr changes as follows, then the optical path 52 of the illumination light changes to the optical path 52A for example. Further approximation is performed here as $k2 \cdot \Delta P \ll na_0$, and $nb_0/na_0 = nr_0$, $-(nb_0 \cdot k2/na_0^2) = k4$.

$$\begin{aligned}nr &\approx nb_0/(na_0 + k2 \cdot \Delta P) \\ &\approx nb_0/(na_0 - (nb_0 \cdot k2/na_0^2) \cdot \Delta P \\ &= nr_0 + k4 \cdot \Delta P\end{aligned} \quad (A3)$$

Then if only the wavelength $\lambda$ changes for $\Delta\lambda$ from the initial status, the relative refractive index nr changes as follows. Here too, further approximation is performed as $k1 \cdot \Delta\lambda \ll na_0$, and $k3/na_0 - (nb_0 \cdot k1/na_0^2) = k5$.

$$\begin{aligned}nr &\approx (nb_0 + k3 \cdot \Delta\lambda)/(na_0 + k1 \cdot \Delta\lambda) \\ &\approx nb_0/(na_0 + (k3/na_0 - nb_0 \cdot k1/na_0^2) \cdot \Delta\lambda \\ &= nr_0 + k5 \cdot \Delta\lambda\end{aligned} \quad (A4)$$

The relationships of the formulas (A3) and (A4) are represented by the lines 54 and 53 in FIG. 13 respectively.

In FIG. 13, the abscissa is the wavelength $\lambda$ and the barometric pressure P, and the ordinate is the relative refractive index nr.

In this case, if the change amount $k5 \cdot \Delta\lambda$ of the relative refractive index nr in the formula (A4) is equal to the change amount $k4 \cdot \Delta P (=\Delta nr)$ of the relative refractive index nr in the formula (A3), then the optical path of the illumination light when only the wavelength $\lambda$ is changed for $\Delta\lambda$ is equal to the optical path 52A when only the barometric pressure is changed for $\Delta P$. This is the above mentioned equivalency. The condition when this equivalency is established is approximately as follows.

$$\Delta\lambda = (k4/k5) \cdot \Delta P \quad (A5)$$

When higher approximation is performed, the change amount $\Delta\lambda$ of the wavelength when the equivalency is established is represented by the following formula using a predetermined function f $(\Delta P)$ of the change amount $\Delta P$ of the refractive index.

$$\Delta\lambda = f(\Delta P) \quad (A6)$$

Therefore to obtain the same image formation characteristics as the case when the barometric pressure P changed for $\Delta P$, the wavelength $\lambda$ is changed for f $(\Delta P)$. The function f $(\Delta P)$ can be determined by the characteristics of the refractive indexes of the glass material of the lens 51 and of the gas around the lens. Also when a plurality of glass materials are used, the wavelength is changed for a value determined by the average value of the change amount f1 $(\Delta P)$, f2 $(\Delta P)$, . . . of the wavelength obtained for each glass material. The reflection components, such as a concave mirror, need not be considered since the optical path of the illumination light does not change even if the refractive index changes.

In the same way, a status equivalent to the case when the temperature and humidity around the projection optical system are changed can be implemented by changing only the wavelength of the illumination light using the change characteristic of the refractive indexes na and nb with respect to temperature and humidity.

Therefore after the image formation characteristics of the projection optical system are measured with setting the wavelength of the illumination light to a predetermined value, the wavelength of the illumination light is changed for a predetermined quantity each time, and the fluctuation amount of the image formation characteristics of the projection optical system is sequentially measured, then the relationship (dependency) of the fluctuation of the image formation characteristics of the projection optical system with respect to the change of the installation environment can be substantially measured in a short time without changing the actual installation environment around the projection optical system.

If an image formation characteristic is the focal discrepancy amount (defocusing amount) F for example, the characteristic shown by the line 55 of FIG. 14, for example, can be obtained by measuring the fluctuation amount of the focal discrepancy amount F of the projection optical system while changing the wavelength $\lambda$ from the initial value $\lambda_0$. When the projection optical system is actually installed in a semiconductor fabrication factory to perform exposure, the installation environment of the projection optical system is continuously measured in a state where the wavelength $\lambda$ is fixed to the initial value $\lambda_0$ for example. Then if the barometric pressure P is changed for $\Delta P1$ from the initial value $P_0$ for example, the fluctuation amount $\Delta P1$ is converted to the fluctuation amount $\Delta\lambda 1$ of the wavelength using the formula (A6), and the corresponding focal discrepancy amount ΔF1 is determined from Δλ1 and the line 55. After this, either the optical element which is a part of the projection optical system is driven so as to offset the fluctuation amount of the image formation characteristics, or the focal position of the substrate with respect to the image formation surface is adjusted, for example, so that exposure is always performed in the best image formation status.

The second adjustment method for a projection optical system according to the present invention is an adjustment method for a projection optical system (11) which projects an image of a pattern on a first surface onto a second surface, characterized in that when the installation environment is different between the assembly location where the projection optical system is assembled and adjusted and the installation location where the projection optical system is used, the wavelength of the illumination light for illuminating the pattern on the first surface is changed according to the change amount of the installation environment when using the projection optical system at the installation location.

In this aspect of the present invention too, changing the wavelength of the illumination light and changing the installation environment (pressure of ambient gas, temperature, humidity) thereof are substantially equivalent, so if the barometric pressure P for example as an installation environment at the installation location changes for ΔP in association with the atmospheric pressure, the corresponding fluctuation Δλ2 of the wavelength when the barometric pressure P changes for −ΔP is calculated using the above formula (A6). Here it is assumed that the fluctuation amount of the image formation characteristics when the barometric pressure changes for ΔP and the fluctuation amount of the image formation characteristics when the barometric pressure changes for −ΔP are the same with the opposite signs. When the wavelength of the illumination light is set to the initial value $\lambda_0$ and is adjusted to obtain the best image formation characteristics at the assembly location, and the projection optical system is operated at the installation location, the wavelength of the illumination light is changed for the fluctuation amount Δλ2, then the fluctuation amount of the image formation characteristics due to the change of the installation environment and the fluctuation amount of the image formation characteristics due to the change of the wavelength are offset, and the best image formation characteristics are obtained.

The third adjustment method for a projection optical system according to the present invention is an adjustment method for a projection optical system (11) which projects an image of a pattern on a first surface onto a second surface, characterized in that when the installation environment is different between the assembly location where the projection optical system is assembled and adjusted and the installation location where the projection optical system is used, the wavelength of the illumination light for illuminating the pattern on the first surface is changed according to the installation environment of the installation location.

In this aspect of the present invention too, changing the wavelength of the illumination light and changing the installation environment thereof are substantially equivalent, so if the barometric pressure P for example as an installation environment changes for ΔP at the installation location, the equivalent fluctuation amount Δλ of the wavelength is calculated using the formula (A6), the wavelength of the illumination light is changed for the calculated fluctuation amount Δλ from the initial value $\lambda_0$ at the assembly location, and the adjustment is made so as to obtain the best image formation characteristics. When the projection optical system is operated at the installation location thereafter, the wavelength of the illumination light is returned to the initial value $\lambda_0$, then the best image formation characteristics are obtained since the installation environment has changed.

The first projection exposure apparatus according to the present invention comprises an illumination optical system (1 to 8) for illuminating a mask pattern (9) with illumination light, and a projection optical system (11) for projecting an image of the mask pattern onto a substrate (12), characterized by comprising a wavelength adjusting device (22) for changing the wavelength of the illumination light, an image formation characteristics measurement system (19) for measuring the change amount of the image formation characteristics of the projection optical system, an installation environment measurement system (20) for measuring the installation environment of the projection optical system, and an image formation characteristics adjustment system (17, 18, 21) for adjusting the image formation characteristics of the projection optical system according to the measurement result of the installation environment measurement system based on the relationship between the change amount of the wavelength of the illumination light and the change amount of the corresponding image formation characteristics thereof.

According to the present invention, the first adjustment method for a projection optical system of the present invention can be implemented by changing the wavelength of the illumination light using the wavelength adjusting device.

The second projection exposure apparatus according to the present invention comprises an illumination optical system (1 to 8) for illuminating a mask pattern (9) with illumination light, and a projection optical system (11) for projecting an image of the mask pattern onto a substrate (12), characterized in by comprising a wavelength adjusting device (22) for changing the wavelength of the illumination light, and a control system (21) for controlling the change amount of the wavelength of the illumination light by the wavelength adjusting device according to the actual change amount or the estimated change amount of the installation environment of the projection optical system. According to the present invention, the second or the third adjustment method for a projection optical system of the present invention can be implemented by changing the wavelength of the illumination light according to the change amount of the installation environment.

An exposure method according to the present invention is an exposure method using a projection optical system which projects an image of a pattern on a first surface onto a second surface, characterized in that the installation environment of the projection optical system is measured and the wavelength of the irradiated light illuminated onto the first surface is changed, so that the difference between the measured environment and the reference environment is substantially offset. According to the exposure method of the present invention, the change of the image formation characteristics of the projection optical system which is generated by the fluctuation of the installation environment of the projection optical system is corrected at high accuracy by changing the wavelength of the illumination light.

It is preferable that the change amount of the image formation characteristics of the projection optical system generated after changing the wavelength is corrected by at least one of changing the wavelength and adjusting the projection optical system.

It is also preferable that the change amount of the image formation characteristics of the projection optical system generated by a factor other than the installation environment is corrected by adjusting the projection optical system or is decreased by changing the wavelength.

A device fabrication method according to the present invention includes a step of transferring a device pattern onto a work piece using the exposure method of the present invention. According to the device fabrication method of the present invention, the change of the image formation characteristics of the projection optical system generated by the fluctuation of the installation environment is corrected, and a high functioning device can be fabricated.

BRIEF DESCRIPTION OF THE DRAWINGS

FIG. 5 is viewed in the Y direction;

BEST MODE FOR CARRYING OUT THE INVENTION

An embodiment of the present invention will now be described with reference to the accompanying drawings.

Figure 1:
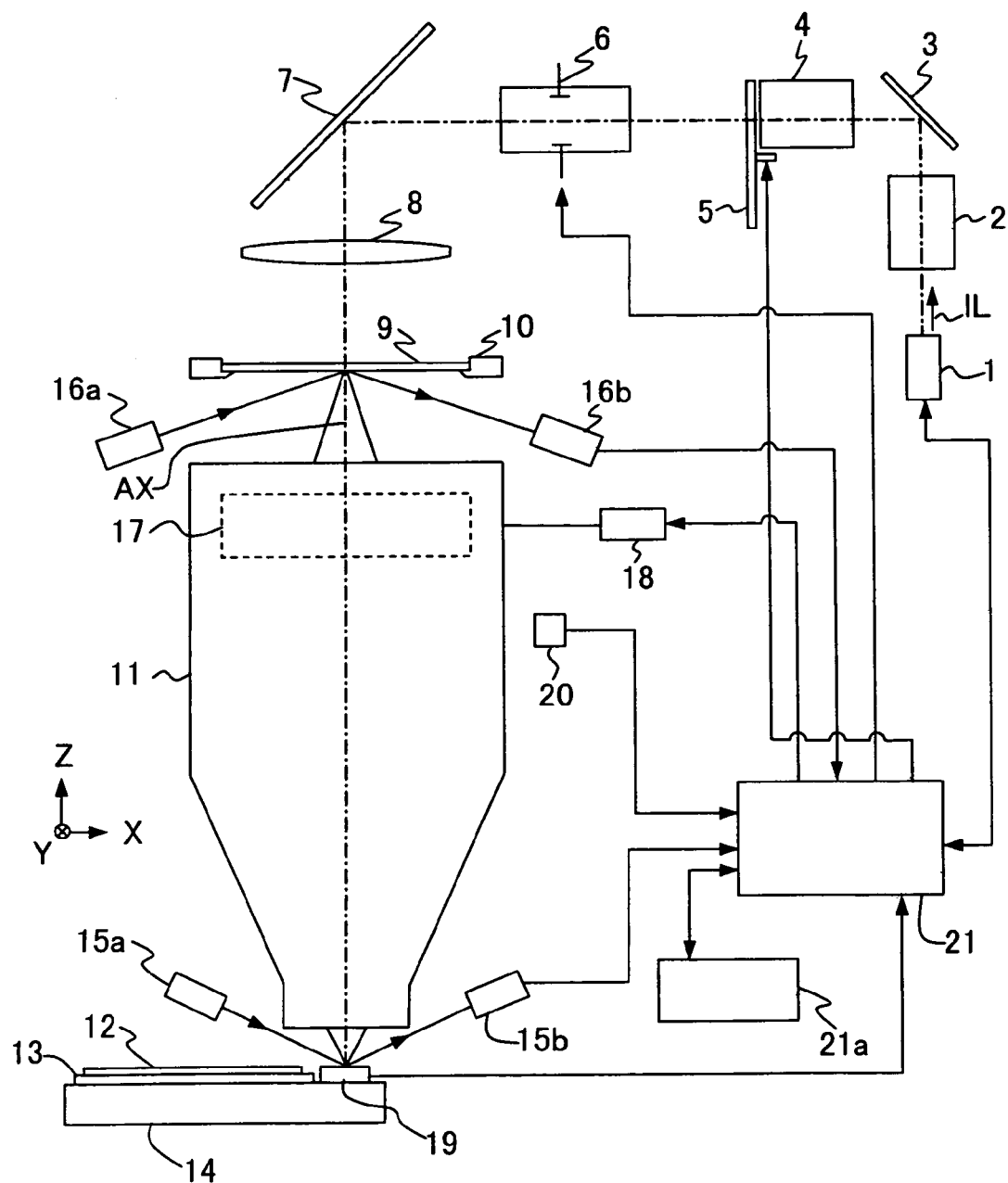
FIG. 1 is a diagram depicting a general configuration of a projection exposure apparatus used for an embodiment of the present invention.

FIG. 1 shows a projection exposure apparatus of the present embodiment. In FIG. 1, the illumination light IL for exposure emitted from the exposure light source 1 provided with a wavelength adjusting device for changing the oscillation wavelength enters a first fly eye lens 2 via a beam-shaping optical system, which is not illustrated. For the exposure light source 1, an excimer laser light source, such as a KrF excimer laser (central wavelength of oscillation of 248.5 nm) or an ArF excimer laser (central wavelength of oscillation of 193.3 nm), $F_2$ laser light source (central wavelength of oscillation of 157.6 nm) or harmonic generator or a YAG laser can be used. A mercury lamp may also be used for the exposure light source 1. An example of the wavelength adjusting device when the exposure light source 1 is a laser light source will now be described with reference to FIG. 3.

Figure 3:
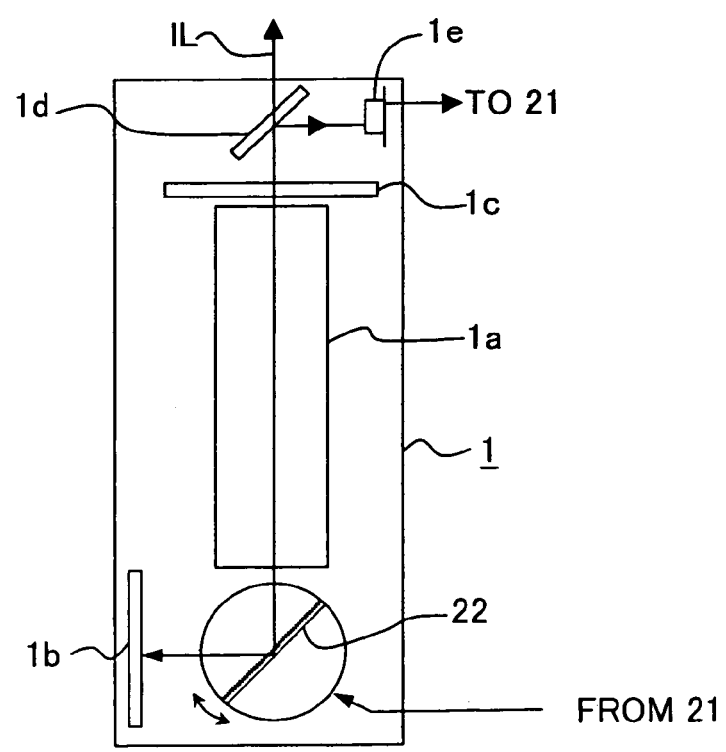
FIG. 3 is a diagram depicting a wavelength control device of an exposure light source 1 in FIG. 1.

FIG. 3 shows the configuration of the exposure light source 11 in FIG. 1. In FIG. 3, a rotary diffraction grating 22 as a wavelength selecting element and a laser resonator 1a are disposed between a mirror 1b and a beam splitter 1c which has a low transmittance, and a laser beam with a wavelength selected by the diffraction grating 22 out of the laser beams oscillated by the laser resonator 1a is emitted outside from the beam splitter 1c and enters a beam splitter 1d which has a high transmittance. The laser beam reflected by the beam splitter 1d enters an output monitor 1e, such as a photo diode, a detection signal of the output monitor 1e is supplied to a main control system 21 which controls the operation of the entire apparatus in FIG. 1, and the laser beam transmitted by the beam splitter 1d is emitted as an illumination light IL for exposure.

In this case, the diffraction grating 22 includes a motor for rotation and a rotary encoder for measuring the rotation angle, and the main control system 21 is configured such that the wavelength of the illumination light IL can be controlled within a predetermined range by controlling the rotation angle of the diffraction grating 22 based on the detection signal of the output monitor 1e. For normal use, the wavelength of the illumination light IL is set to approximately the central wavelength of the laser light source by locking the rotation angle of the diffraction grating 22 in a state where the detection signal of the output monitor 1e is at the maximum, for example. To control the wavelength of the illumination light IL as described later, on the other hand, the rotation angle of the diffraction grating 22 is set such that the detection signal of the output monitor 1e becomes the maximum, then the rotation angle of the diffraction grating 22 is changed for a predetermined step angle each time so that the wavelength is gradually changed from the central wavelength. For this, the relationship between the change amount of the rotation angle of the diffraction grating 22 and the change amount of the wavelength of the illumination light IL is theoretically (or experimentally) determined in advance, and the relationship is recorded in a memory 21a which is comprised of a magnetic disk device connected to the main control system 21 in FIG. 1. And using this relationship, the diffraction grating 22 is rotated according to the wavelength to be changed to.

Besides the above method, it is also possible that a rotary encoder, which can measure the absolute value of the rotation angle of the diffraction grating 22 within a predetermined narrow range at high resolution, is provided, the relationship between the absolute value of the rotation angle of the diffraction grating 22 and the wavelength of the illumination light IL is determined and stored in the memory 21a in advance, and the wavelength of the illumination light IL is directly set based on this relationship. If the exposure light source 1 is a KrF excimer laser light source, the wavelength can be changed within the range of approximately 248.5±0.3 nm, and if the exposure light source 1 is an ArF excimer laser light source, the wavelength can be changed within the range of approximately 193.3±0.3 nm. For the wavelength selection element, a plurality of prisms which are arranged in series or a Fabry-Parot etalon can be used other than the diffraction grating 22.

Figure 2:
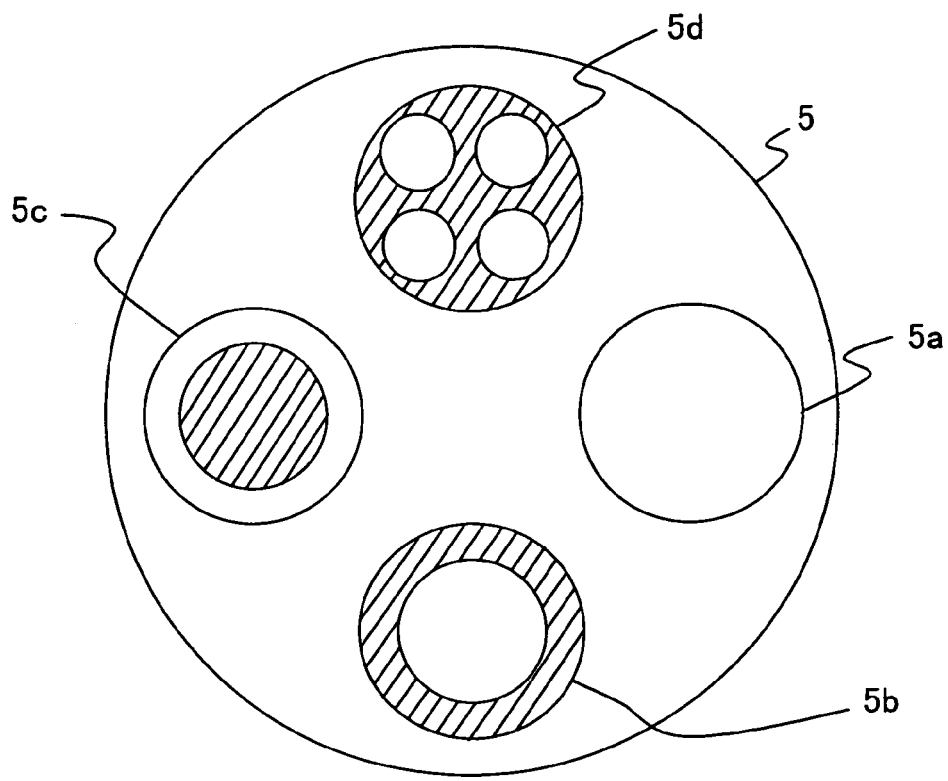
FIG. 2 is a diagram depicting a plurality of a diaphragms created on a diaphragm adjusting plate 5.

In FIG. 1, the illumination light IL emitted from the first fly eye lens 2 is reflected by the vibrating mirror 3 which is vibrating to decrease speckles of the laser beam, and enters the second fly eye lens 4 via a relay lens, which is not illustrated. On the optical Fourier transformation surface with respect to the emission surface of the second fly eye lens 4, that is, the pattern surface of the transfer target reticle 9, a rotary diaphragm adjusting plate 5 is disposed. On the diaphragm adjusting plate 5, an aperture diaphragm (hereafter "σ diaphragm") 5a which is normally circular, a σ diaphragm 5b for a small coherence factor (σ value), a ring-shaped σ diaphragm 5c, and a σ diaphragm 5d for modified illumination (inclined illumination) comprised of a plurality of eccentric apertures, are arranged as shown in FIG. 2. In FIG. 1, when a reticle is replaced, for example, the main control system 21 sets the σ diaphragm in accordance with the type and the fineness of the transfer target pattern to be on the optical path of the illumination light from the second fly eye lens 4 by rotating the diaphragm adjusting plate 5, so as to optimize the illumination conditions.

The illumination light IL, which passed through the predetermined σ diaphragm of the diaphragm adjusting plate 5, enters the reticle blind (variable field stop) 6 via the relay lens, which is not illustrated, and the illumination light IL which passed through the reticle blind 6 illuminates the pattern surface (bottom surface) of the reticle 9 at a uniform illumination distribution via a relay lens, which is not illustrated, the mirror 7, and the capacitor lens 8. The arrangement surface of the reticle blind 6 is conjugated with the pattern face thereof, and the illumination area on the reticle 9 is defined by the aperture in the reticle blind 6. Under the illumination light IL, the image of the pattern of the reticle 9 is projection-exposed onto the surface of a wafer 12 where photoresist is coated as a substrate at projection magnification β (β is ¼ or ⅕ for example) via the projection optical system 11. The wafer 12 is, for example, a disk-shaped substrate made of a semiconductor (e.g. silicon) or SOI (Silicon-On-Insulator). In FIG. 1, which shows a state of measuring the image formation characteristics of the projection optical system 11, the wafer 12 is outside the exposure area (area which is conjugated with the above mentioned illumination area with respect to the projection optical system 11 and to which the pattern image is projected) of the projection optical system 11. In the description below, the Z axis is in parallel with the optical axis AX of the projection optical system 11, and the X axis is in parallel with the paper surface in FIG. 1, and the Y axis is vertical to the paper surface in FIG. 1, on a plane vertical to the Z axis.

The reticle 9 is held on the reticle stage 10, and the reticle stage 10 performs fine positioning of the reticle R in the X direction, Y direction and rotation direction. The main control system 21 controls the operation of the reticle stage 10 based on the position measurement result of the laser interferometer, which is not illustrated.

The wafer 12 is held on the wafer holder 13 by vacuum suction, and the wafer holder 13 is secured on the wafer stage 14. The wafer stage 14 is comprised of an XY stage section which positions the wafer 12 in the X direction and Y direction, and a Z stage section which controls the position (focal position) of the wafer 12 in the optical axis AX direction (Z direction) of the projection optical system 11. The Z stage section further comprises a leveling mechanism for controlling the inclination angle of the wafer 12. The main control system 21 controls the position of the XY stage section of the wafer stage 14 in the X direction and Y direction based on the position measurement result of the laser interferometer, which is not illustrated. At exposure, when exposure of the pattern image of the reticle 9 onto a one shot area on the wafer 12 ends, the next shot area is moved to the exposure position by the step shift of the wafer stage 14, and exposure is executed, and this operation is repeated as a step and repeat system. In this way, the projection exposure apparatus of the present example is a stepper type (batch exposure type), but it is needless to say that the present invention can be applied when the projection exposure apparatus is a scan exposure type, such as a step-and-scan system, creating a continuous shift mechanism to the rectangle stage 10 in a predetermined direction (e.g. Y direction).

[Auto Focus Sensor and How to Use it]

To execute the above mentioned exposure, the surface of the wafer 12 (wafer surface) must be aligned to the image surface of the projection optical system 11 by an auto focus system and an auto leveling system. For this, an optical type oblique incidence system auto focus sensor (hereafter "AF sensor") is disposed at the wafer 12 side and the reticle 9 side respectively.

In other words, on the side face of the projection optical system 11 at the image surface side, an AF sensor comprised of an irradiation optical system 15a for projecting slit images to a plurality of measurement points on the wafer surface (or a reference surface for measurement) diagonally with respect to the optical axis AX, and a condensing optical system 15b for forming images of the slit images again by receiving reflection lights from the wafer surface and generating a plurality of focus signals according to the horizontal discrepancy amount of the plurality of slit images formed again (hereafter "AF sensor 15") is disposed, and the focus signals are supplied to the main control system 21. By the focus signals, the positional discrepancy amount in the Z direction at each measurement point on the wafer surface can be determined. On the side face of the projection optical system 11 at the object surface side at a position symmetrical to the AF sensor 15, as well, an AF sensor comprised of an irradiation optical system 16a and a condensing optical system 16b for detecting the positional discrepancy amount in the Z direction at a plurality of measurement points on a pattern surface (reticle face) of the reticle 9 (hereafter "AF sensor 16") is disposed, and the plurality of focus signals of the condensing optical system 16b are also supplied to the main control system 21.

The main control system 21 calculates the positional discrepancy amount of the wafer surface in the Z direction with respect to the reference surface at the image surface side, and the positional discrepancy amount of the reticle surface in the Z direction with respect to the reference surface at the object surface side, using these focus signals, calculates the focal discrepancy amount on the wafer surface with respect to the image surface of the projection optical system 11 based on these positional discrepancy amounts, and drives the Z stage section in the wafer stage 14 so as to offset the calculated focal discrepancy amount so that the focal position on the wafer surface matches with the image surface. Also the inclination angles of the wafer surface and the reticle surface with respect to these reference surfaces are calculated, the inclination angle of the wafer surface with respect to the image surface is determined by these inclination angles, and the main control system 21 drives the Z stage section so as to offset the inclination angle.

The detailed configuration of the AF sensor 15 at the wafer side is disclosed in Japanese Patent Application Laid-Open No. 5-243121 and the corresponding U.S. Pat. No.

5,502,311, for example. The configuration disclosed here can be applied to the AF sensor 16 at the reticle side as well. The above mentioned disclosures of the Japanese and US patents are incorporated hereinto by reference so long as national laws of the designated countries or elected countries, designated or elected by the present international application permit the incorporation.

If the projection exposure apparatus in FIG. 1 is a scanning exposure type, the focal position on the wafer surface may be changed during scanning exposure by a flexure of the reticle surface and by bumps on the wafer surface, so measurement by the AF sensors 15 and 16 are executed successively at a predetermined sampling rate during scanning exposure, and the Z stage section in the wafer stage 14 is driven so as to offset the focal discrepancy amount and the inclination angle of the wafer surface, which are calculated based on the measurement results.

An example of how to set the reference surface to be the reference to calculate the above mentioned focal discrepancy amount and the inclination angle will now be described. In this case, it is assumed that the height of the reticle stage 10 and the focal position on the pattern surface of the reticle 9 are set at a designed position on the object surface of the projection optical system 11, and a test reticle, where a predetermined evaluation mark is created, is loaded on the reticle stage 10 instead of reticle 9. In this state, an average surface determined by the focal position on the reticle surface measured by the AF sensor 16 is regarded as the reference surface at the object surface side, and offset correction is performed so that the focal position measured by the AF sensor 16 becomes 0 on this reference surface.

Then an unexposed wafer on which photoresist is coated is loaded on the wafer stage 14, the wafer is moved in steps for a predetermined width each time, in the X direction and Y direction, also the position in the Z direction is sequentially changed for a predetermined width each time, and the image of the evaluation mark is exposed on a series of shot areas on the wafer. When exposing each shot area in this way, the focal position on the wafer surface is measured respectively using the AF sensor 15. Then after developing the wafer, the shape of each evaluation mark in the series of shot areas on the wafer is observed by an optical microscope, for example, a shot area where the shape is best is determined, and the surface determined by the focal position measured by the AF sensor 15 when exposed in this shot area is regarded as the reference surface at the image surface side. In other words, offset correction is performed so that the focal position measured by the AF sensor 15 becomes 0 on this reference surface. After setting two reference surfaces in this way, the measurement values of the two AF sensors 15 and 16 are the focal positional discrepancy amount from each reference surface, so the focal discrepancy amount on the wafer surface can be easily calculated, as mentioned later.

In this example, the focal position on the reticle surface is also measured, but the AF sensor 16 at the reticle side may be omitted by setting the focal position on the reticle surface to be a fixed value, since the focal position on the reticle surface hardly changes in such a stepper type (batch exposure type) projection exposure apparatus as this example. In the case of a scanning exposure type, however, the flexure amount may change depending on the position of the reticle, so it is preferable to dispose the AF sensor 16. In the present example, an oblique incidence type sensor was used as the AF sensor, but the exact same effect as the present example is implemented with other methods, such as a method of directly measuring a position in the Z direction on the reticle surface or wafer surface by an interferometer, a method of directly measuring the focal discrepancy amount on the wafer surface by TTR (Through The Reticle) type via the projection optical system, or a method of measuring a space between the projection optical system and the wafer using a gas type micrometer.

[Configuration and Operation of Image Formation Characteristics Correction Section]

To perform the above mentioned exposure, the image formation characteristics of the projection optical system 11 must be maintained in good status at all times. So, the image formation characteristics correction section 17 is disposed in the projection optical system 11 in FIG. 1, so that the image formation characteristics control section 18 maintains the image formation characteristics of the projection optical system 11 to a predetermined best status under the control of the main control system 21 via the image formation characteristics correction section 17.

Figure 4:
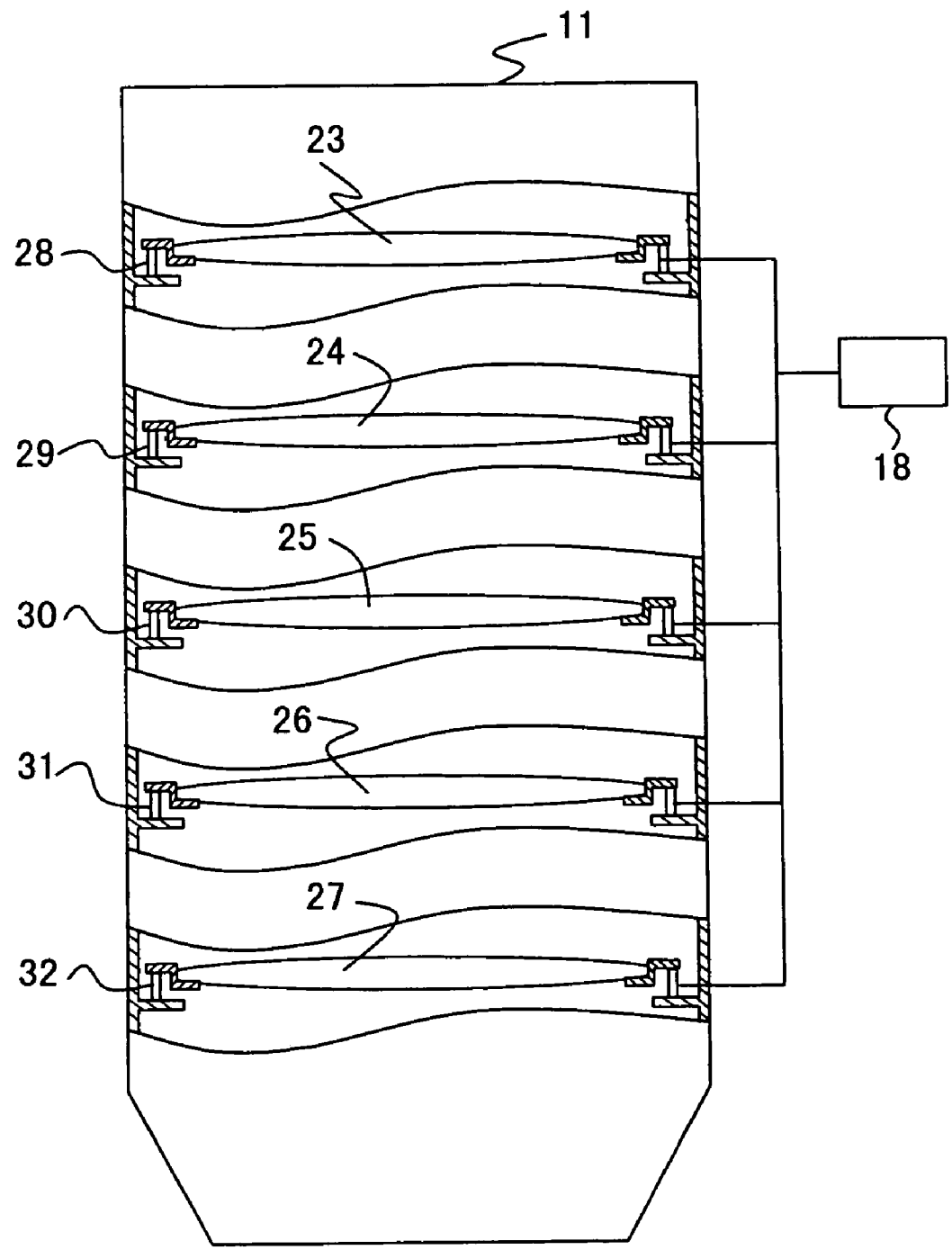
FIG. 4 is a diagram depicting a part of the configuration of the image formation characteristics correction section of the projection optical system 11 in FIG. 1.

FIG. 4 shows a configuration example of the image formation characteristics correction section 17 in FIG. 1, and in FIG. 4, five lenses, 23 to 27, out of the many lenses constituting the projection optical system 11, are installed in a lense barrel via the lens frame, and drive elements 28 to 32, comprised of piezoelectric elements which are extendable in the optical axis direction of the projection optical system 11 respectively, are disposed. For example, the drive element 28 is disposed at three locations around the optical axis at equal angle intervals, and the lens 23 moves in the optical axis direction (Z direction) by extending the drive elements 28 at the three locations for the same amount in the direction, and the inclination angle of the lens 23 is changed by extending the drive elements 28 at the three locations in the direction independently from one another. The other drive elements 29 to 32 are also disposed at three locations, and the position of the optical axis and inclination angle of the lenses 24 to 27 as well can be controlled within a predetermined range. At least one of the lenses 23 to 27 may be a group of a plurality of lenses, and also the lenses (lens group) to be driven are not limited to five locations, but can be arbitrary.

A position sensor, which is not illustrated, is disposed near each drive element 28 to 32 for measuring the position of the tip of the corresponding drive elements 28 to 32 respectively. For the position sensor, a capacitance type gap sensor, optical or capacitance type linear encoder, or an interferometer can be used, and the measurement result of the position sensor is supplied to the image formation characteristics control section 18. The image formation characteristics control section 18 controls the extension amount of the drive elements 28 to 32 based on the measurement results, so that the position in the optical axis direction and inclination angles of the lenses 23 to 27 are independently set to the status instructed by the main control system 21. By combining the drive amount for the positions and inclination angles of the lenses 23 to 27, distortion, magnification error, curvature of image field, coma aberration and spherical aberration, for example, out of the image formation characteristics of the projection optical system 11, can be corrected.

When the drive amount of these five lenses 23 to 27 in the optical axis direction is $G_1$ to $G_5$ respectively, the focal discrepancy amount F, curvature of image field CU, magnification error M, distortion D, coma aberration CO, and spherical aberration SA are represented as follows using the coefficients $C_{11}$ to $C_{65}$. The coefficients $C_{11}$ to $C_{65}$ can be experimentally determined by actually driving the lenses 23 to 27, and measuring each image formation characteristic using a later mentioned image formation characteristics measurement mechanism.

$$\begin{bmatrix} F \\ CU \\ M \\ D \\ CO \\ SA \end{bmatrix} = \begin{bmatrix} C_{11} & C_{12} & \cdots & C_{15} \\ C_{21} & C_{22} & \cdots & C_{25} \\ \vdots & & \ddots & \vdots \\ C_{61} & C_{62} & \cdots & C_{65} \end{bmatrix} \cdot \begin{bmatrix} G_1 \\ G_2 \\ G_3 \\ G_4 \\ G_5 \end{bmatrix} \quad (1)$$

These coefficients $C_{11}$ to $C_{65}$ may be determined by calculation based on high precision optical simulation.

In the present example, a component for driving a plurality of lenses (or lens group) is used for the image formation characteristics correction section 17, but a device for controlling the pressure of gas in a space which is between predetermined lenses constituting the projection optical system 11, and which is sealed may be used. The component for driving the lenses and the device for controlling the pressure of the gas between lenses may be combined and used.

The correction mechanism of the image formation characteristics is not limited to the mechanism of the present example, but may be any mechanism, such as inserting a flat correction plate having bump distribution to offset various aberrations of the projection optical system into the optical path, or a reticle moving mechanism.

[Image Formation Characteristics Measurement Mechanism and Measurement Method Thereof]

The image formation characteristics measurement mechanism for the projection optical system 11 and the measurement method thereof will now be described. In FIG. 1, a photoelectric detection section 19 is disposed near the wafer holder 13 on the wafer stage 14. The surface of the photoelectric detection section 19 is set at the same height as the surface of the wafer 12, and when the image formation characteristics are measured, the photoelectric detection section 19 moves to the base of the projection optical system 11 by the drive of the XY stage of the wafer stage 14, as shown in FIG. 1.

Figure 5:
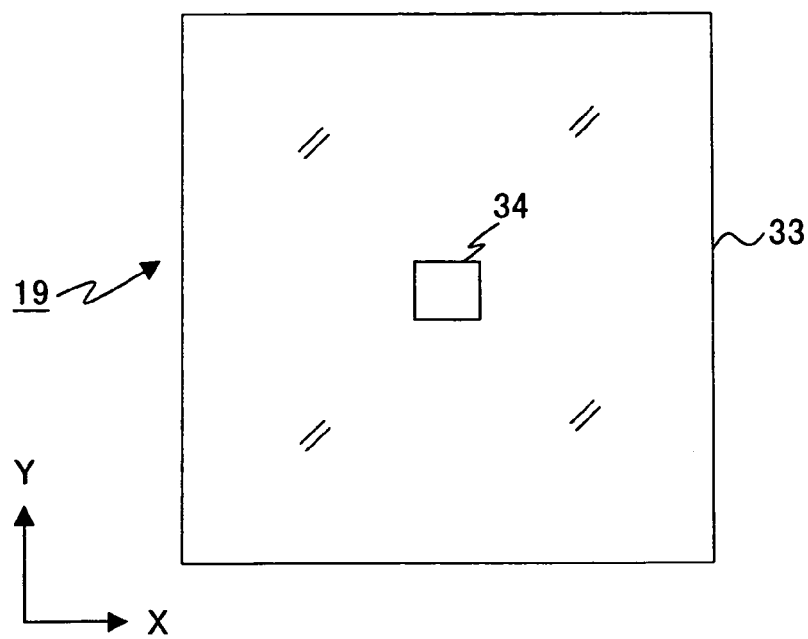
FIG. 5 is an enlarged plan view depicting a photoelectric detection section 19 in FIG. 1.
Figure 6:
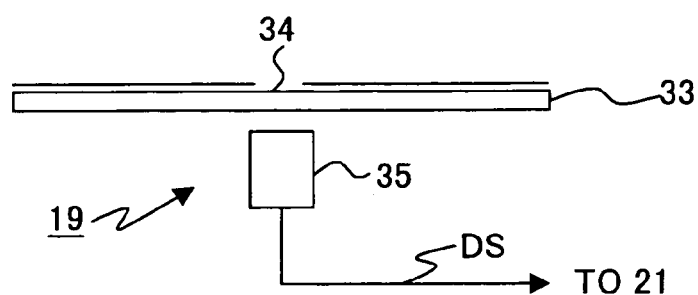
FIG. 6 is a cross-sectional view of a part of shielding film when

FIG. 5 is an enlarged plan view depicting the photoelectric detection section 19, and FIG. 6 is a cross-sectional view of a part of FIG. 5 viewed in the Y direction, and in FIG. 5 and FIG. 6, a parallel plate 33, which transmits the illumination light for exposure is set at the top of the photoelectric detection section 19, a shielding film made of chrome film is formed on the surface of the parallel plate 33, and a square aperture 34, which transmits the illumination light, is created at the center of the shielding film by etching.

The photoelectric sensor 35 having a light receiving section to cover the aperture 34 is set at the bottom face of the parallel plate 33, so that the illumination light, which is emitted from the projection optical system 11 in FIG. 1 and is transmitted through the aperture 34, is received by the photoelectric sensor 35, and the detection signal DS of the photoelectric sensor 35 is supplied to the main control system 21 in FIG. 1. For the photoelectric sensor 35, a photo-multiplier or a photo diode, for example, can be used.

Figure 7:
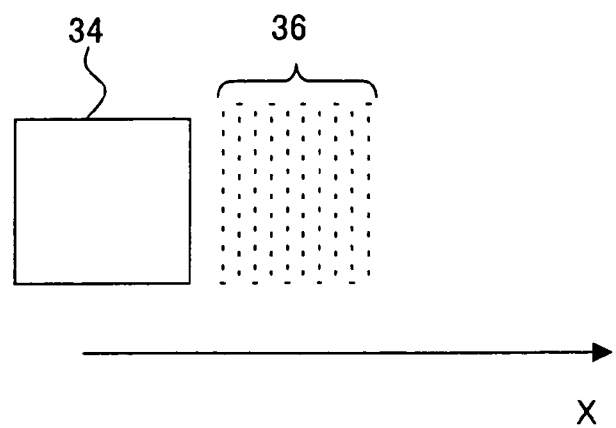
FIG. 7 is an enlarged view depicting the relationship between the aperture of the photoelectric detection section 19 and the projected images.

To measure the image formation characteristics, a test reticle, where a predetermined characteristics evaluation mark is drawn, is loaded on the reticle stage 10 instead of the reticle 9 in FIG. 1, and the wafer stage 14 is positioned so that the characteristics evaluation mark and the aperture 34 of the photoelectric detection section 19 in FIG. 5 are approximately in a conjugate relationship. Then, the illumination light IL is irradiated, and the image of the characteristics evaluation mark 36 is projected near the aperture 34 of the photo detection section 19, as shown in FIG. 7. Normally, for the characteristics evaluation mark, a plurality of periodic patterns (e.g. line and space patterns) arranged corresponding to the plurality of measurement points in the exposure area of the projection optical system 11 are used, and the entire width of the image of the characteristics evaluation mark 36 in the periodic direction, that is, the measurement direction (X direction in FIG. 7) is shorter than the width of the aperture 34 in the X direction. In this state, the wafer stage 14 is driven and the photoelectric detection section 19 is scanned in the X direction so that the aperture 34 crosses the image of the characteristics evaluation mark 36, then the main control system 21 stores the detection signal DS of the photoelectric detection section corresponding to the X coordinate of the wafer stage 14.

Figure 8:
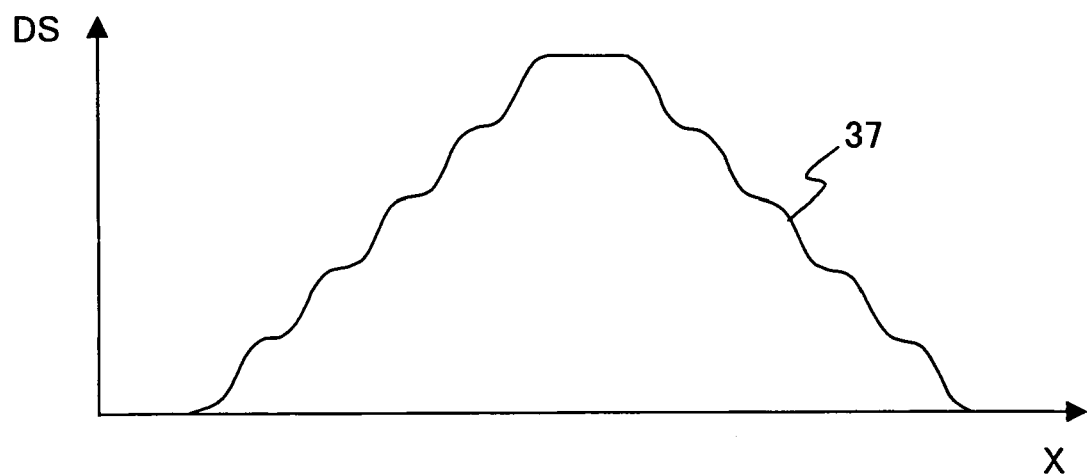
FIG. 8 is a diagram depicting the detection signal obtained from the photoelectric detection section 19 when the image formation characteristics are measured.
Figure 9:
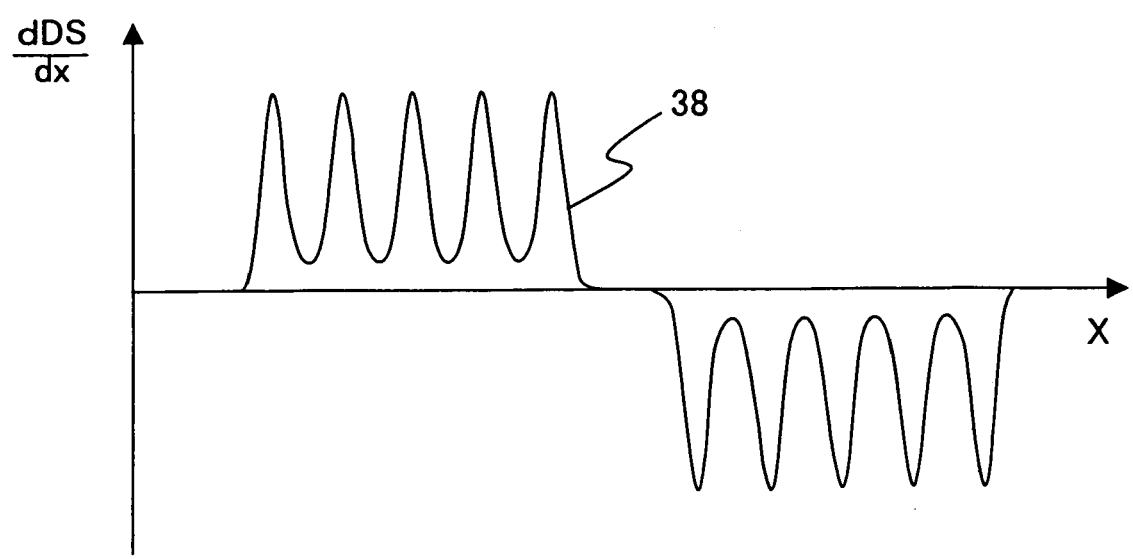
FIG. 9 is a diagram depicting a signal obtained by differentiating the detection signal in FIG. 8 by a position in the scan direction.

As a result, as the curve 37 in FIG. 8 shows, the detection signal DS, which changes in steps corresponding to the position X in the scanning direction, is obtained. The detection signal DS corresponds to the integrated light quantity when the light quantity of the image of the characteristics evaluation mark 36 is integrated with respect to the scanning direction. So the detection signal DS is differentiated with respect to the position X in the scanning direction by the operation part of the main control system 21, and the differential signal dDS/dX is obtained as shown in the curve 38 in FIG. 9. This differential signal dDS/dX is a signal when the light quantity distribution of the image of the characteristics evaluation mark 36 in the X direction is reproduced, and the operation part in the main control system 21 determines the amplitude and the central position in the X direction of the differential signal dDS/dX by performing Fourier series expansion for the differential signal dDS/dX, for example. The amplitude and the central position indicate the contrast and projection position of the image of the characteristics evaluation mark 36 respectively. Since the characteristics evaluation mark is projected onto the plurality of measurement points in the exposure area of the projection optical system 11, as mentioned above, the main control system 21 determines the contrast and the projection position of the image of the characteristics evaluation mark at the plurality of measurement points. And by processing these measurement results, the following image formation characteristics of the projection optical system 11 are determined.

(A) Best Focus Position and Curvature of Image Field

When the contrast and the projection position of the image of the characteristics evaluation mark projected onto the plurality of measurement points in the exposure area of the projection optical system 11 are measured as described above, the Z stage section of the wafer stage 14 is driven at each measurement point, and the contrast of the image of the characteristics evaluation mark is measured respectively while changing the focal position of the photoelectric detection section for a predetermined amount each time. When measurement is performed in this way, the focal position on the surface of the parallel plate 33 of the photoelectric detection section 19 is measured in advance, using the AF sensor 15 in FIG. 1.

Then the focal position, when the contrast (the amplitude of the differential signal dDS/dX in FIG. 9) of the image of the characteristics evaluation mark is highest at each measurement point, is determined as the best focal position (position of image surface). At this time, the average value of the best focal positions determined at the plurality of measurement points, for example, is regarded as the best focal positions of the projection optical system 11. The best focal position determined like this is the discrepancy amount with respect to the reference surface at the wafer side determined by the test printing as mentioned above, which means that the reference surface determined by test printing is calibrated in the present example.

Also, the curvature of the image field of the projection optical system 11 is determined by the distribution of the best focal positions determined at the plurality of measurement points.

At each measurement point, each characteristics evaluation mark in the X direction and Y direction of the measurement direction (periodic direction) may be projected so as to determine the projection positions in the two measurement directions at each measurement point. In this case, in order to determine the best focal position at each measurement point, the average value of the best focal positions in the two measurement directions can be determined. Also, astigmatism can be determined by determining the difference of the best focal positions in the two measurement directions at each measurement point.

(B) Magnification Error and Distortion

The image projection positions of the plurality of evaluation marks of the test reticle are measured as mentioned above, the interval between the image projection positions of the evaluation marks is calculated, and the calculated interval is divided by the predetermined interval between the corresponding evaluation marks on the test reticle, so as to determine the projection magnification $\beta$ of the projection optical system 11. The error $\Delta\beta$ of the projection magnification $\beta$ from the design value $\beta_0$ is the magnification error. Distortion can be determined by determining the discrepancy amount of the image projection position of each evaluation mark from the design position at the plurality of measurement points, where the interval with respect to the optical axis is different from each other, in the exposure area of the projection optical system 11.

(C) Spherical Aberration

To determine a spherical aberration, a plurality of periodic marks with different pitches are created in advance as an individual evaluation mark on the test reticle, the best focal positions of the images of these periodic marks with different pitches are measured at measurement points approximately on the optical axis of the projection optical system 11, and the change amounts of the best focal positions are determined.

(D) Coma Aberration

To determine coma aberration, the image projection positions of the periodic marks with different pitches are measured at measurement points distant from the optical axis of the projection optical system 11 using the test reticle used for spherical aberration measurement, and the discrepancy amounts of the projection positions are determined.

The image formation characteristics measurement mechanism is not limited to the mechanism of the above-mentioned example, but can be any mechanism which can measure image formation characteristics.

[Measurement of Dependency of Image Formation Characteristics of the Projection Optical System on Installation Environment]

For exposure, the image formation characteristics of the projection optical system must be maintained to be in good status at all times, but if the installation environment (e.g. barometric pressure of gas, temperature and humidity around the projection optical system) is different between the "assembly location" where the projection optical system is assembled and adjusted, and the "installation location", such as a semiconductor fabrication factory, where the projection optical system 11 is installed and exposure is actually executed, then the image formation characteristics obtained at the assembly adjustment cannot be accurately reproduced at the installation location. Therefore in FIG. 1, an environment sensor 20 for measuring the pressure of gas (barometric pressure), temperature and humidity around the projection optical system 11, is disposed near the projection optical system 11, and the measurement results by the environment sensor 20 are supplied to the main control system 21. A sensor similar to the environment sensor 20 is also installed at the assembly location of the projection optical system 11.

Assembly and adjustment of the projection optical system at the assembly location are performed in a chamber where the temperature and humidity of gas inside are controlled, and at the installation location, the projection exposure apparatus equipping the projection optical system is operated in a chamber where the temperature and humidity of gas inside are highly controlled. However, gas (e.g. air where the percentage of ozone is low, nitrogen or helium) to be supplied into the chamber at the assembly location and into the chamber at the installation location is supplied at a pressure approximately the same as the pressure of the air in the cleanroom outside the chambers, that is, a pressure approximately the same as the atmospheric pressure of the assembly location or the installation location respectively, so if the atmospheric pressure is different between the assembly location and the installation location due to a difference of altitude, for example, the image formation characteristics of the projection optical system change. Therefore, in the following description it is assumed that the fluctuation characteristics of the image formation characteristics due to the fluctuation of the barometric pressure (approximately the same as the atmospheric pressure of the assembly location or the installation location) around the projection optical system are determined without considering the fluctuation of the image formation characteristics due to the change of temperature and humidity of the gas around the projection optical system.

If the temperature and humidity around the projection optical system change between the assembly location and the installation location, and if the image formation characteristics may change beyond the tolerance, then both the temperature and humidity can be set as parameters which influence the image formation characteristics so as to be corrected in the same way as the barometric pressure, to be described below.

First, the focal discrepancy amount $F_{PRESS}$ of the image formation characteristics is represented as follows using the change amount $\Delta P$ of the barometric pressure around the projection optical system 11. The change amount $\Delta P$ of the barometric pressure is regarded approximately as the change amount of the atmospheric pressure.

$$F_{PRESS} = K_{FP} \times \Delta P \quad (2)$$

The coefficient $K_{FP}$ here is the change ratio of the focal discrepancy amount with respect to the change amount of the barometric pressure. In the same way, using the coefficients $K_{CUP}$, $K_{MP}$, $K_{DP}$, $K_{COP}$ and $K_{SAP}$, which are the change ratios with respect to the barometric pressure respectively, the change amount of each image formation characteristic is represented with the change amount ΔP of the barometric pressure as follows.

$$\begin{bmatrix} F_{PRESS} \\ CU_{PRESS} \\ M_{PRESS} \\ D_{PRESS} \\ CO_{PRESS} \\ SA_{PRESS} \end{bmatrix} = \begin{bmatrix} K_{FP} \\ K_{CUP} \\ K_{MP} \\ K_{DP} \\ K_{COP} \\ K_{SAP} \end{bmatrix} \cdot \Delta P \quad (3)$$

The formula (3) includes formula (2), and the meaning of the change amount of each image formation characteristics is as follows.

$F_{PRESS}$: focal discrepancy amount due to change of barometric pressure $CU_{PRESS}$: change amount of curvature of image field due to change of barometric pressure $M_{PRESS}$: change amount of projection magnification due to change of barometric pressure (magnification error)

$D_{PRESS}$: change amount of distortion due to change of barometric pressure $CO_{PRESS}$: change amount of coma aberration due to change of barometric pressure $SA_{PRESS}$: change amount of spherical aberration due to change of barometric pressure The values of coefficients $K_{FP}$ to $K_{SAP}$ when the barometric pressure changes may be different depending on the illumination conditions and the exposure conditions, including σ diaphragms 5a to 5d of the diaphragm adjusting plate 5 in FIG. 2, the type of pattern of reticle 9 (pattern information), and the numerical aperture of the projection optical system 11. In this case, the coefficients are measured for each illumination condition and exposure condition, and optimum coefficients are used according to the illumination conditions and the exposure conditions at exposure.

A problem here is how to determine the values of the coefficients $K_{FP}$ to $K_{SAP}$ when the barometric pressure changes. The most accurate method is to store the projection optical system 11 inside the barometric pressure chamber where the barometric pressure is adjustable at the assembly location of the projection optical system 11, and measuring the change amount of each image formation characteristic while changing the barometric pressure inside, but with this method, which requires a large and high precision pressure chamber, manufacturing cost increases.

As described above, the optical system uses the fact that changing the wavelength λ of the illumination light is substantially equivalent to changing the ambient barometric pressure P. And by approximating the refractive index of the gas around the projection optical system 11 and the refractive index of the glass material of the lenses constituting the projection optical system 11 by, for example, formulas corresponding to the formula (A1) and the formula (A2) respectively, the conversion relationship between the change amount Δλ of the wavelength λ and the change amount ΔP of the barometric pressure P is calculated by, for example, the formula (A5). To use a plurality of types of glass materials, a formula averaging the formulas determined for each glass material, for example, can be used. Using a predetermined coefficient K6 calculated in this way, the relationship becomes Δλ=K6·ΔP. This means that to obtain a status where only the barometric pressure P has changed for ΔP, only the wavelength λ of the illumination light is changed for K6·ΔP while keeping the barometric pressure P constant.

So at the assembly location of the projection optical system 11 in FIG. 1, where a projection exposure apparatus for assembly and adjustment having the same configuration in FIG. 1 is used, the wavelength of the illumination light IL of the exposure light source 1 is set to the central wavelength $\lambda_0$, the above mentioned test reticle is loaded instead of the reticle 9, and each image formation characteristic of the focus discrepancy amount to spherical aberration is set to the best status while measuring each image formation characteristic using the photoelectric detection section 19 in a state where the drive amounts of the lenses 23 to 27 for image characteristic correction in FIG. 4 are set to 0 (neutral state) respectively. The residual error of each image formation characteristic measured at this time is measured and recorded.

Then using the environment sensor 20, the barometric pressure ($P_{ini}$) around the projection optical system 11 is measured. After changing the wavelength λ of the illumination light IL for Δλs by rotating the diffraction grating 22 of the exposure light source 1 in FIG. 3, the image formation characteristics of the focal discrepancy amount to spherical aberration are measured again using the photoelectric detection section 19. In the same way, while changing the wavelength of the illumination light IL of the exposure light source 1 to be 2·Δλs, 3·Δλs . . . , n·Δλs (n is an integer of 2 or more), the image formation characteristics of the focal discrepancy amount to the spherical aberration are measured using the photoelectric detection section 19 respectively. Also while changing the wavelength of the illumination light IL of the exposure light source 1 to be −Δλs, −2·Δλs, . . . , −n·Δλs with respect to the central wavelength $\lambda_0$, the image formation characteristics of the focal discrepancy amount to the spherical aberration are measured respectively.

Figure 10:
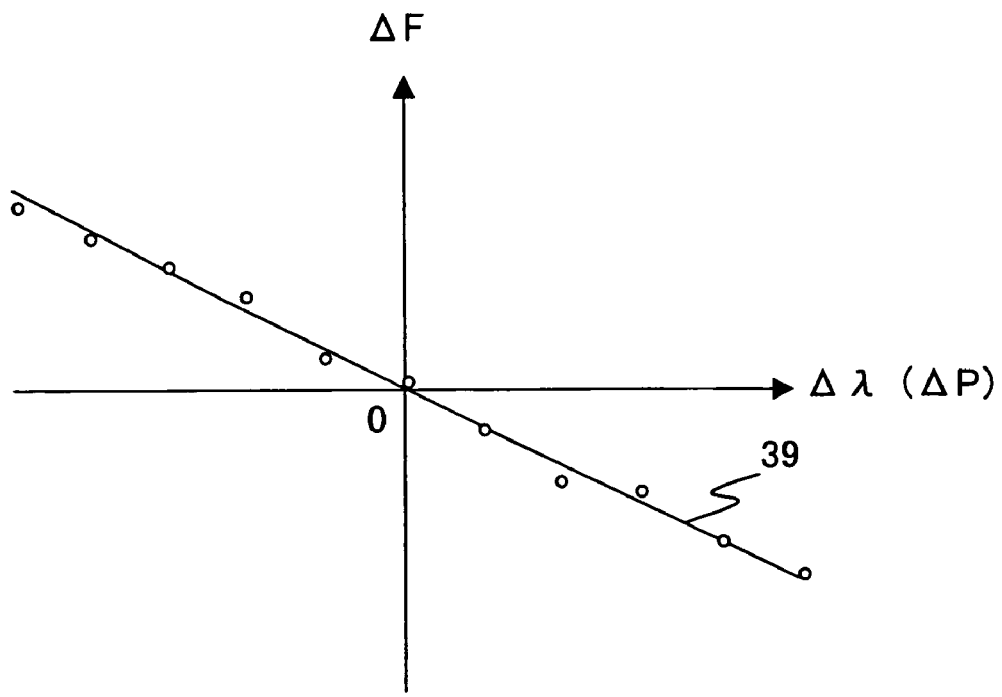
FIG. 10 is a diagram depicting the measurement data obtained by measuring the change amount of the focal discrepancy amount when the wavelength of the illumination light IL in FIG. 1 is changed.
Figure 11:
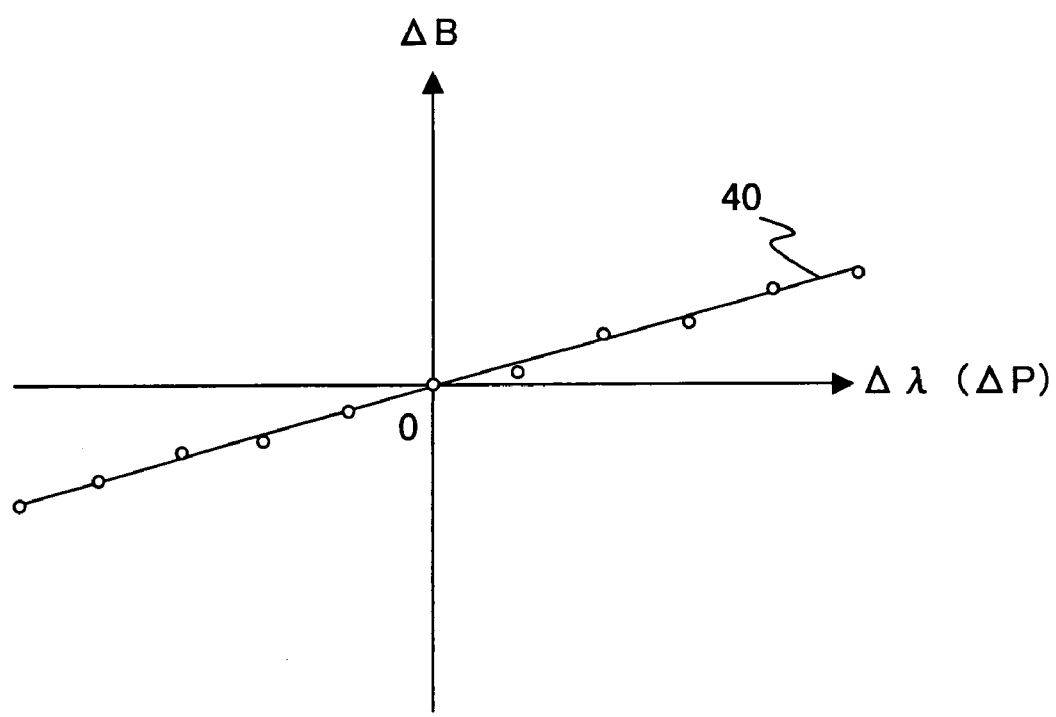
FIG. 11 is a diagram depicting the measurement data obtained by measuring the change amount of a magnification error when the wavelength of the illumination light IL in FIG. 1 is changed.
Figure 12:
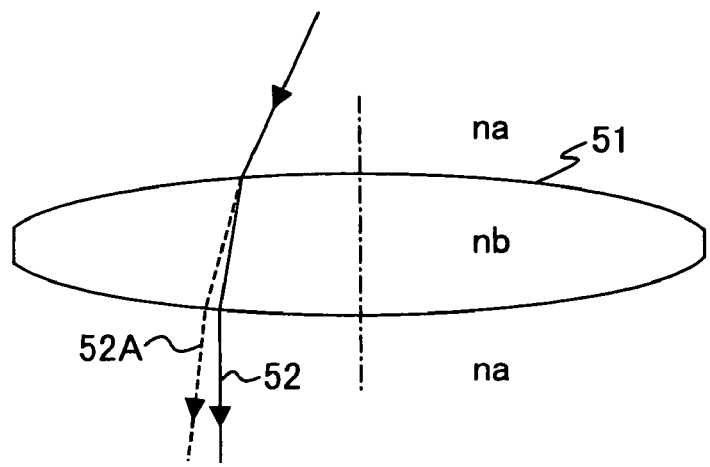
FIG. 12 is a diagram depicting an optical path of the illumination light to enter a lens.
Figure 13:
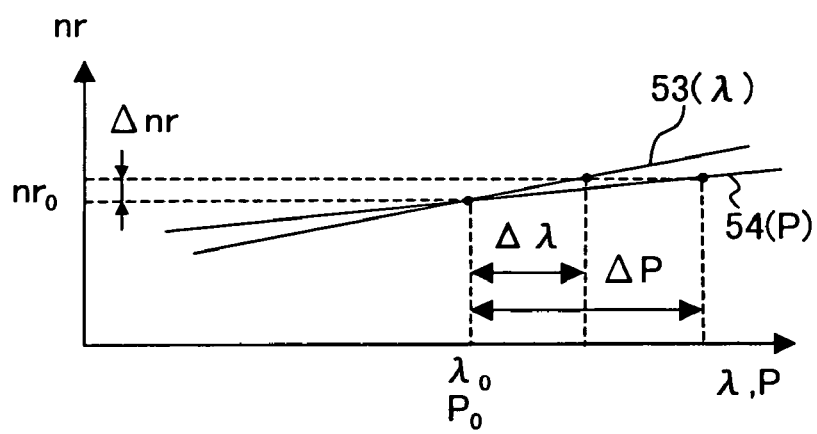
FIG. 13 is a diagram depicting an approximate relationship of the relative refractive index nr of the lens, wavelength $\lambda$ of the illumination light, and pressure P of the ambient gas.
Figure 14:
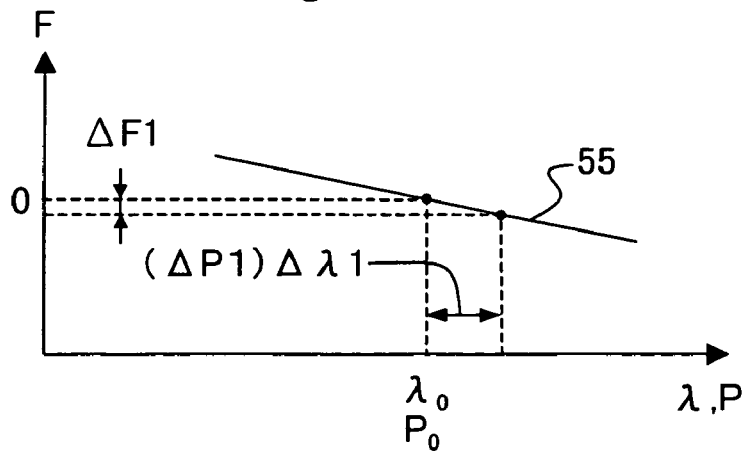
FIG. 14 is a diagram depicting an approximate relationship of the focal discrepancy amount F, wavelength $\lambda$ of the illumination light, and pressure P of the ambient gas.

FIG. 10 and FIG. 11 show the focal discrepancy amount ΔF and the magnification error ΔB of the image formation characteristics measured as mentioned above. The abscissa in FIG. 10 and FIG. 11 indicates the change amount Δλ of the wavelength of the illumination light IL, and the change amount Δλ is converted to the change amount ΔP of the barometric pressure using the above formula (Δλ=K6·ΔP).

Then a least square approximation is performed on the measurement data of each image formation characteristic so as to calculate the coefficients $K_{FP}$, $K_{CUP}$, $K_{MP}$, $K_{DP}$, $K_{COR}$ and $K_{SAP}$, to indicate the change ratio of the focal discrepancy amount to the spherical aberration with respect to the change amount ΔP of the barometric pressure. In the examples in FIG. 10 and FIG. 11, if the measurement data is approximated by the least square approximation lines 39 and 40 respectively, the inclinations of the least square approximation lines 39 and 40 become the coefficient $F_{PRESS}$ of the focal discrepancy amount ΔF, and the coefficient $M_{PRESS}$ of the magnification error ΔB. These coefficients $K_{FP}$ to $K_{SAP}$ and the information on the barometric pressure $P_{ini}$ at the assembly and adjustment of the projection optical system 11 are stored in the memory 21a connected to the main control system 21 in FIG. 1.

[Image Formation Characteristics Correction Method at Installation Location]

As mentioned above, it is assumed that the barometric pressure at the assembly location of the projection optical system 11 is $P_{ini}$ and the barometric pressure around the projection optical system 11 (approximately equal to the atmosphere at the installation location) during the exposure process at the installation location, such as a semiconductor fabrication factory, where the projection exposure apparatus equipping the projection optical system 11, is $P_{run}$. In this case, when the barometric pressure $P_{run}$ at the installation location is different from the barometric pressure $P_{ini}$ at the assembly location, the best image formation characteristics cannot be obtained if the wavelength λ of the illumination light IL of the exposure light source 1 is set to the central wavelength $λ_0$. So to obtain the best image formation characteristics, the main control system 21 measures the ambient barometric pressure. $P_{run}$ by the environment sensor 20 during the exposure process in FIG. 1, and the change amount ΔP ($=P_{run}-P_{ini}$), with respect to the barometric pressure $P_{ini}$ at the assembly location stored in the memory 21a, is calculated.

Then the main control system 21 substitutes the coefficients $K_{FP}$ to $K_{SAP}$ stored in the memory 21a and the change amount ΔP of the barometric pressure in the formula (3), and calculates from the focal discrepancy amount $F_{PRESS}$ to the change amount of the spherical aberration $SA_{PRESS}$. As a result, the focal discrepancy amount F, curvature of the image field CU, magnification error M, distortion D, coma aberration CO and spherical aberration SA in the exposure process become as follows.

$$\begin{bmatrix} F \\ CU \\ M \\ D \\ CO \\ SA \end{bmatrix} = \begin{bmatrix} F_{PRESS} \\ CU_{PRESS} \\ M_{PRESS} \\ D_{PRESS} \\ CO_{PRESS} \\ SA_{PRESS} \end{bmatrix} \quad (4)$$

So in order to correct five image formation characteristics, excluding focal discrepancy amount F, by driving the lenses 23 to 27 in FIG. 4, the main control system 21 determines the drive amounts $G_1$ to $G_5$ of the lenses 23 to 27 in the optical axis direction using the following formula corresponding to the inverse conversion of a part of the formula (1).

$$\begin{bmatrix} G_1 \\ G_2 \\ G_3 \\ G_4 \\ G_5 \end{bmatrix} = -\begin{bmatrix} C_{21} & \cdots & C_{25} \\ \vdots & \ddots & \vdots \\ C_{61} & \cdots & C_{65} \end{bmatrix}^{-1} \cdot \begin{bmatrix} CU \\ M \\ D \\ CO \\ SA \end{bmatrix} \quad (5)$$

The main control system 21 supplies the drive amounts $G_1$ to $G_5$ determined by the formula (5) to the image formation characteristics control section 18 in FIG. 4 and drives the lenses 23 to 27. By this, the curvature of the image field CU, magnification error M, distortion D, coma aberration CO and spherical aberration SA are controlled within the tolerance respectively.

By driving the lenses 23 to 27, however, a new focal discrepancy amount is generated as a side effect. The main control system 21 determines the new focal discrepancy amount FG using a part of the coefficients in the formula (1).

$$FG = \begin{bmatrix} C_{11} & C_{12} & C_{14} & C_{14} & C_{15} \end{bmatrix} \cdot \begin{bmatrix} G_1 \\ G_2 \\ G_3 \\ G_4 \\ G_5 \end{bmatrix} \quad (6)$$

Generally the focal discrepancy amount FL of the projection optical system 11, including the change amount due to barometric pressure and change amount due to a shift of lens group, becomes as follows.

$$FL=F+FG \quad (7)$$

This focal discrepancy amount FL can be corrected by driving the Z stage section of the wafer stage 14 in FIG. 1.

Now how to correct the focal discrepancy amount will be described. In FIG. 1, the positional discrepancy amount Rz of the pattern surface of the reticle 6 (reticle surface) in the Z direction from the above mentioned reference surface is measured by the AF sensor 16 at the reticle side, and the positional discrepancy amount Wz of the surface of the wafer 12 (wafer surface) in the Z direction from the above mentioned reference surface is measured by the AF sensor 15 at the wafer side. And using the projection magnification β of the projection optical system 11, the main control system 21 calculates the focal discrepancy amount dF with respect to the image surface of the projection optical system 11 on the wafer surface as follows.

$$dF=Rz\times\beta^2-Wz \quad (8)$$

If the focal discrepancy amount FL of the formula (7) is 0, the Z stage of the wafer stage 14 is moved in the Z direction so that the focal discrepancy amount dF of the formula (8) becomes 0. By this, the conjugate relationship between the reticle 9 and the wafer 12 is maintained. When the projection exposure apparatus in FIG. 1 is a step-and-scan type, for example, if the reticle surface shifts 10 μm in the Z direction during scanning of the reticle 9, the image surface moves 0.625 μm in the Z direction when the projection magnification β is 0.25. If the wafer 12 is shifted 0.625 μm in the Z direction by driving the Z stage at this time, the focal discrepancy amount dF of the formula (8) becomes 0.

If the image surface of the projection optical system 11 is changed for the focal discrepancy amount FL, as shown in the formula (7), by the change of barometric pressure around the projection optical system 11, the focal discrepancy amount FL is added to the formula (8) and the focal discrepancy amount dF' is calculated.

$$dF'=FL+Rz\times\beta^2-Wz \quad (9)$$

And the main control system 21 drives the Z stage section of the wafer stage 14 so as to offset the focal discrepancy amount dF'. By this, exposure can always be executed at high resolution in a focused state, even if the barometric pressure around the projection optical system 11 changes.

[Highland Offset]

In the above embodiment, when the installation environment of the projection optical system changes, best characteristics are obtained by correcting the image formation characteristics of the projection optical system according to the installation environment. However, it is also possible to create a substantially same installation environment (pseudo-installation environment) as the installation location of the projection optical system in advance at the assembly and adjustment of the projection optical system. Here the barometric pressure around the projection optical system is considered as the installation environment. Also here, it is assumed that the ambient barometric pressure is the same as the atmospheric pressure of the installation location of the projection optical system. Since the atmospheric pressure changes depending on the meteorological conditions, the annual average atmospheric pressure is considered below.

The annual average atmospheric pressure becomes lower as the altitude becomes higher. So the average change amount $\Delta P$ between the installation location and the assembly location is determined by the difference between the altitude of the assembly location and the altitude of the installation location of the projection optical system. It is preferable that the difference between the average atmospheric pressure actually observed at the installation location and the average atmospheric pressure observed during assembly of the projection optical system at the assembly location is regarded as the change amount $\Delta P$.

A first technique is setting the wavelength of the illumination light IL to the central wavelength $\lambda_0$ at the assembly and adjustment of the projection optical system 11, and making adjustment so as to obtain the best image formation characteristics. In this case, at the installation location, the wavelength of the illumination light IL is changed for $-\Delta\lambda$ with respect to the central wavelength $\lambda 0$, where $-\Delta\lambda$ is the change amount of the wavelength of the illumination light which causes a change amount of the image formation characteristics by which the change amount of the image formation characteristics due to the change amount $\Delta P$ of the atmospheric pressure $\Delta P$ is offset. As a result, the change amount of the image formation characteristics due to the change amount $\Delta P$ of the atmospheric pressure and the change amount $-\Delta\lambda$ of the wavelength totals approximately 0, so the approximately best image formation characteristics are obtained at the installation location. The advantages of this method are that the manufacturing cost of the projection optical system 11 is decreased, and changes of the installation locations can be flexibly handled since complicated wavelength control at the assembly, and adjustment of the projection optical system 11 is unnecessary.

A second technique is setting each image formation characteristic of the projection optical system 11 at the best status by shifting the wavelength of the illumination light IL of the exposure light source 1 in FIG. 1 for $\Delta\lambda$ with respect to the central wavelength $\lambda_0$ at the assembly location, where $\Delta P$ is the change amount of the atmospheric pressure and $\Delta\lambda$ is the change amount of the wavelength of the illumination light IL equivalent to the change amount $\Delta P$ of the atmospheric pressure. When the projection optical system 11 is operated at the installation location thereafter, the wavelength of the illumination light IL of the exposure light source 1 is returned to the central wavelength $\lambda_0$. Since the atmospheric pressure has changed $\Delta P$ at this time, the best image formation characteristics, which are the same as at assembly and adjustment, can be obtained. With this method, the wavelength of the illumination light of all the projection exposure apparatuses are constant, so the reliability of the exposure light source itself is kept high and maintenance is also easy.

Using these methods, the adjustment operation amount for the projection optical system at the installation location can be considerably decreased even if there is an atmospheric pressure difference due to the altitude difference between the assembly location and the installation location of the projection optical system.

It is also possible that the atmospheric pressure is measured at the beginning of exposing one lot, for example, the change amount of the atmospheric pressure from the standard atmospheric pressure of the installation location is determined, and the wavelength of the illumination light is changed according to the change amount of the atmospheric pressure so as to correct the image formation characteristics.

If the projection optical system is a projection optical system comprised of a single glass material, the change of the image formation characteristics due to the change of the atmospheric pressure can be completely corrected by changing the wavelength of the illumination light, but if the projection optical system is comprised of a plurality of types of glass materials, the change of the image formation characteristics due to the change of the atmospheric pressure cannot be completely corrected merely by changing the wavelength of the illumination light. So if the projection optical system is comprised of a plurality of types of glass materials, a residual error of the image formation characteristics is corrected by driving the lens for the image formation characteristics correction after changing the wavelength of the illumination light.

Since the change of the atmospheric pressure and the change of image formation characteristics thereby are small in such a short time as exposing one lot, the change of the image formation characteristics due to the change of atmospheric pressure during exposing one lot can be corrected by driving the lens for the image formation characteristics correction.

The atmospheric pressure may be measured successively so that the image formation characteristics are corrected by changing the wavelength of the illumination light in real-time, or the wavelength of the illumination light may be changed when wafers are exchanged or at each exposure shot. The image formation characteristics may be corrected by changing the wavelength of the illumination light when the atmospheric pressure changed more than a predetermined tolerance, and in this case, the loss of time for changing the wavelength of the illumination light can be minimized.

Image formation characteristics may be corrected by changing the wavelength of the illumination light using the time for changing the aperture diaphragm and reticle when a double exposure is executed, and in this case, the loss of time for changing the wavelength of the illumination light can be decreased.

The fluctuation of the image formation characteristics due to the irradiation of the illumination light may also be corrected by changing the wavelength of the illumination light. In this case, the irradiation fluctuation model is experimentally determined by simulation for each one of the plurality of typical wavelengths, then stored. When the resist sensitivity is changed by the change of wavelength as well, parameters of the integrated exposure are switched, just like the case when the fluctuation of the image formation characteristics due to the irradiation of the illumination light is corrected. In either case, the correction values may be calculated by interpolation calculation for the wavelengths among the stored models, and by this, a higher precision exposure can be executed by less data management.

Applications of the projection exposure apparatus of the above embodiment are not limited to the projection exposure apparatus for semiconductor fabrication, but the present embodiment can be widely applied to cases of exposing liquid crystal display element patterns on a square glass plate, and cases of fabricating such image sensing devices as a CCD, plasma display element, or a thin film magnetic head.

For the illumination light for exposure of the projection exposure apparatus, harmonics may be used, wherein a DFB semiconductor laser or a single wavelength laser in an infrared or visible area oscillated from a fiber laser is amplified by a fiber amplifier where erbium (Er) (or both erbium and ytterbium (Yb)) for example, is doped, and the wavelength is converted to ultraviolet using non-linear optical crystals. In this case, X8 harmonics in the 193 to 194 nm range, that is, ultraviolet lights with a wavelength approximately the same as an ArF excimer laser, may be obtained while the oscillation wavelength of a single wavelength laser is in the 1.544 to 1.553 μm range, for example, or X10 harmonics in the 157 to 158 nm range, that is, ultraviolet lights with a wavelength approximately the same as an $F_2$ laser, may be obtained while the oscillation wavelength is in the 1.57 to 1.58 μm range.

When such far ultraviolet rays, such as an excimer laser, are used for the illumination light for exposure of the projection exposure apparatus, materials for far ultraviolet rays to transmit, such as quartz ($SiO_2$) and fluorite ($CaF_2$), are used for the glass material of the projection optical system. The projection optical system may be any dioptric system, catoptric system, and cata-dioptric system comprised of a dioptric lens and a catoptric element such as a concave mirror. For the cata-dioptric system, an optical system where a plurality of dioptric elements and two catoptric elements (at least one a concave mirror) arranged on an optical axis line without being bent can be used, as disclosed in U.S. Pat. No. 5,788,229, for example. The disclosure of this US Patent is incorporated hereinto so long as the national laws of designated countries or elected countries designated or elected in the present international application permit the incorporation.

The projection exposure apparatus of the above embodiment can be manufactured by incorporating an illumination optical system and projection optical system comprised of a plurality of lenses into the exposure apparatus main unit with performing optical adjustment, and mounting the reticle stage and wafer stage comprised of many mechanical parts into the projection exposure apparatus main unit with connecting wires and pipes, as well as performing total adjustment (e.g. electrical adjustment and operation check). It is preferable to manufacture the projection exposure apparatus in a cleanroom where temperature and cleanness are controlled.

The semiconductor device is fabricated via a step of designing the functions and performance of the device, a step of fabricating a reticle based on this step, a step of fabricating a wafer from silicon material, a step of exposing a pattern of the reticle onto the wafer by the projection exposure apparatus of the above mentioned embodiment, a step of assembling the device (including dicing step, bonding step, and packing step), an inspection step and other steps.

It is needless to mention that the present invention is not limited by the above mentioned embodiment, and various configurations are possible within the scope of the subject matter of the present invention. All contents of the disclosure, including descriptions, claims, drawings and abstract in the Japanese Patent Application No. 10-262802 filed on Sep. 17, 1998, are incorporated into the present application by reference.

INDUSTRIAL APPLICABILITY

According to the first adjustment method for a projection optical system of the present invention, the relationship (dependency) of the fluctuation amount of the image formation characteristics of the projection optical system with respect to the change of the installation environment can be measured substantially in a short time by changing the wavelength of the illumination light without actually changing the installation environment around the projection optical system. Also according to the present invention, such a huge projection optical system as a cata-dioptric system now in use can easily be assembled and adjusted at low manufacturing cost, without using a huge pressure chamber.

According to the second or third adjustment method for a projection optical system of the present invention, when the installation environment (e.g. atmospheric pressure) is different between the assembly location of the projection optical system and the installation location of the projection optical system, the projection optical system can be substantially adjusted according to the installation environment of the installation location without changing the installation environment of the assembly location.

According to the first or second projection exposure apparatus of the present invention, the first adjustment method for a projection optical system of the present invention or the second or third adjustment method for a projection optical system of the present invention can be implemented respectively.

And according to the exposure method of the present invention, changes of the image formation characteristics of the projection optical system generated due to the fluctuation of the installation environment can be corrected at high precision. Also according to the device fabrication method of the present invention, high function devices can be fabricated.

The invention claimed is:

1. An adjustment method for a projection optical system which projects an image of a pattern on a first surface onto a second surface, comprising:
    changing at least one condition of illumination condition for illuminating the pattern on the first surface and structural condition of the pattern in various ways;
    changing a wavelength of illumination light for illuminating the pattern on the first surface for each condition, and detecting a change amount of image formation characteristics of an image projected onto the second surface via the projection optical system; and
    determining a predetermined relationship between a change amount of installation environment of the projection optical system and the change amount of the image formation characteristics for each condition based on a result of the detection.

2. The adjustment method for a projection optical system according to claim 1, wherein when the installation environment of the projection optical system changes, the image formation characteristics of the projection optical system is adjusted based on the predetermined relationship.

3. The adjustment method for a projection optical system according to claim 2, wherein the image formation characteristics of the projection optical system are adjusted by changing the wavelength of the illumination light based on the predetermined relationship.

4. The adjustment method for a projection optical system according to claim 3 wherein gas whose barometric pressure changes in association with the atmospheric pressure is supplied inside the projection optical system, and the change of the installation environment of the projection optical system is the change of the atmospheric pressure.

5. The adjustment method for a projection optical system according to claim 2, wherein gas whose barometric pressure changes in association with the atmospheric pressure is supplied inside the projection optical system, and the change of the installation environment of the projection optical system is the change of the atmospheric pressure.

6. The adjustment method for a projection optical system according to claim 1, wherein the predetermined relationship is determined based on the first relationship between the change amount of the installation environment and the change amount of the wavelength, and the second relationship between the change amount of the wavelength and the change amount of the image formation characteristics.

7. The adjustment method for a projection optical system according to claim 6, wherein the first relationship is determined based on the refractive index characteristics of the glass material of the projection optical system and the refractive index characteristics of gas around the projection optical system.

8. The adjustment method for a projection optical system according to claim 7, wherein the projection optical system is comprised of a plurality of types of glass materials, and the first relationship is determined by equalizing the relationship between the change amount of the installation environment and the change amount of the wavelength determined for each one of the plurality of types of glass materials.

9. The adjustment method for a projection optical system according to claim 1, wherein the change amount of the image formation characteristics due to the change of the wavelength of the illumination light is detected in a state where the installation environment of the projection optical system is maintained to be constant.

10. An adjustment method for a projection optical system which projects an image of a pattern on a first surface onto a second surface, comprising:
when assembling and adjusting the projection optical system at an assembly location, in case an environment of the assembly location where the projection optical system is assembled and adjusted is different from an environment of a relocated location where the projection optical system is used,
changing a wavelength of an illumination light for illuminating the pattern on the first surface from a predetermined wavelength by an amount according to the environment of the relocated location in advance, and then assembling and adjusting the projection optical system under a condition of the changed wavelength; and
setting the wavelength to the predetermined wavelength when the projection optical system is used in the relocated location.

11. The adjustment method for a projection optical system according to claim 10, wherein when the projection optical system is used in the relocated location, the wavelength of the illumination light is set to a wavelength according to the environment of the assembly location.

12. The adjustment method for a projection optical system according to claim 10 wherein gas whose barometric pressure changes in association with the atmospheric pressure is supplied inside the projection optical system, and the change of the installation environment of the projection optical system is the change of the atmospheric pressure.

13. An exposure method for illuminating a pattern formed on a first surface by an illumination light and projecting an image of the pattern onto a second surface via a projection optical system, comprising:
a first step of determining information on a change amount of predetermined image formation characteristics of the projection optical system caused by a predetermined factor;
a second step of selecting at least one of a first technique for adjusting the predetermined image formation characteristics by changing a wavelength of the illumination light and a second technique for adjusting the predetermined image formation characteristics, the second technique being different from the first technique; and
a third step of correcting the change amount of the predetermined image formation characteristics caused by the predetermined factor using the at least one selected technique in the second step,
wherein in the second step, both the first technique and the second technique are selected, and in the third step, a residue of the change amount of the predetermined image formation characteristics which the first technique could not correct is corrected by the second technique after executing the first technique.

14. The exposure method according to claim 13, wherein in the first step, the change amount of the predetermined image formation characteristics is determined based on the result of measurement of an installation environment of the projection optical system.

15. The exposure method according to claim 14, wherein the change amount of the installation environment is the difference between the measured environment and a predetermined reference environment.

16. The exposure method according to claim 13, wherein the second technique is the adjustment of the projection optical system.

17. The exposure method according to claim 16, wherein the adjustment of the projection optical system is performed by a first adjustment for moving at least one lens of the projection optical system in the optical axis direction of the projection optical system or inclining the lens with respect to the optical axis, or by a second adjustment for controlling the barometric pressure in a space sealed between a predetermined part of lenses of the projection optical system.

18. The exposure method according to claim 13, wherein the projection optical system is comprised of a plurality of types of glass materials.

19. A device manufacturing method comprising transferring the device pattern onto a work piece using the exposure method according to claim 13.

20. An exposure method of illuminating a pattern formed on a first surface by an illumination light and projecting an image of the pattern onto a second surface via a projection optical system, comprising:
a first step of determining information on a change amount of predetermined image formation characteristics of the projection optical system caused by a predetermined factor;
a second step of selecting at least one of a first technique for adjusting the predetermined image formation characteristics by changing a wavelength of the illumination light and a second technique for adjusting the predetermined image formation characteristics, the second technique being different from the first technique; and a third step of correcting the change amount of the predetermined image formation characteristics caused by the predetermined factor using the at least one selected technique in the second step, wherein when a change amount of an installation environment is greater than or equal to a predetermined value, the first technique is selected in the second step.

21. An exposure method using a projection exposure apparatus for illuminating a pattern formed on a mask by an illumination light and projecting an image of the pattern of the mask onto a substrate via a projection optical system, comprising:

measuring an installation environment of the projection optical system to determine a change amount of the installation environment, and changing a wavelength of the illumination light according to the change amount of the installation environment at each exposure shot.

22. The exposure method according to claim 21, wherein the wavelength of the illumination light is changed while performing an operation for changing the substrate or an operation for changing the pattern of the mask or an operation for changing an aperture diaphragm that defines an illumination area of the illumination light on the mask.

23. A device manufacturing method comprising transferring the device pattern onto a work piece using the exposure method according to claim 21.

24. A projection exposure apparatus comprising an illumination optical system which illuminates a mask pattern by an illumination light, and a projection optical system which projects the image of the mask pattern onto a substrate, the apparatus comprising:

a wavelength adjusting device which changes a wavelength of the illumination light;

an image formation characteristics measurement system which measures a change amount of image formation characteristics of the projection optical system;

a control system which is electrically connected to the wavelength adjusting device and the image formation characteristics measurement system, changes at least one condition of illumination condition for illuminating the mask pattern and structural condition of the mask pattern in various ways, controls the formation characteristics measurement system to measure a change amount of the image formation characteristics while changing the wavelength by the wavelength adjusting device for each condition, and determines a predetermined relationship between a change amount of the installation environment of the projection optical system and the change amount of the image formation characteristics based on the measurement results for the each condition; and a memory which is electrically connected to the control system and stores the predetermined relationship determined by the control system for the each condition.

25. A projection exposure apparatus comprising an illumination optical system which illuminates a mask pattern by an illumination light and a projection optical system which projects an image of the mask pattern onto a substrate, the projection exposure apparatus comprising:

a measurement device which determines information on a change amount of predetermined image formation characteristics of the projection optical system caused by a predetermined factor;

a first image formation characteristics adjustment system which is electrically connected to the measurement device and adjusts the predetermined image formation characteristics by a first technique for changing a wavelength of the illumination light; and a second image formation characteristics adjustment system which is electrically connected to the measurement device and adjusts the predetermined image formation characteristics by a second technique which is different from the first technique, wherein the projection exposure apparatus uses both the first image formation characteristics adjustment system and the second image formation characteristics adjustment system to correct the change amount of the predetermined image formation characteristics caused by the predetermined factor, and allows the second image formation characteristics adjustment system to adjust a residue of the change amount of the predetermined image formation characteristics which the first image formation characteristics adjustment system could not correct.

26. The projection exposure apparatus according to claim 25, wherein the second image formation characteristics adjustment system adjusts the image formation characteristics by adjusting the projection optical system.

27. The projection exposure apparatus according to claim 26, wherein the projection optical system is comprised of a plurality of types of glass materials.

28. A projection exposure apparatus comprising an illumination optical system which illuminates a mask pattern by an illumination light and a projection optical system which projects an image of the mask pattern onto a substrate, the projection exposure apparatus comprising:

a measurement device which determines information on a change amount of predetermined image formation characteristics of the projection optical system caused by a predetermined factor;

a first image formation characteristics adjustment system which is electrically connected to the measurement device and adjusts the predetermined image formation characteristics by a first technique for changing a wavelength of the illumination light; and a second image formation characteristics adjustment system which is electrically connected to the measurement device and adjusts the predetermined image formation characteristics by a second technique which is different from the first technique, wherein:

the projection exposure apparatus selects at least one of the first image formation characteristics adjustment system and the second image formation characteristics adjustment system, and corrects the change amount of the predetermined image formation characteristics caused by the predetermined factor using the at least one selected image formation characteristics adjustment system;

the measurement device determines the change amount of an installation environment of the projection optical system as the information; and when the change amount of the installation environment is a predetermined value or more, the projection exposure apparatus selects the first image formation characteristics adjustment system.

29. A projection exposure apparatus comprising an illumination optical system which illuminates a mask pattern by an illumination light, and a projection optical system which projects an image of the mask pattern onto a substrate, the projection exposure apparatus comprising:

a wavelength adjusting device which changes a wavelength of the illumination light; and an installation environment measurement system which measures an installation environment of the projection optical system and determines a change amount of the installation environment, wherein the wavelength adjusting device changes the wavelength of the illumination light according to the change amount of the installation environment at each exposure shot.

30. The projection exposure apparatus according to claim 29, wherein the wavelength adjusting device changes the wavelength while performing an operation for changing the substrate or an operation for changing the mask pattern or an operation for changing an aperture diaphragm that defines an illumination area of the illumination light on the mask pattern.

31. An exposure method for illuminating a pattern formed on a first surface by an illumination light and projecting an image of the pattern onto a second surface via a projection optical system, comprising:

a first step of determining information on a change amount of predetermined image formation characteristics of the projection optical system caused by a predetermined factor;

a second step of selecting at least one of a first technique for adjusting the predetermined image formation characteristics by changing a wavelength of the illumination light and a second technique for adjusting the predetermined image formation characteristics, the second technique being different from the first technique; and a third step of correcting the change amount of the predetermined image formation characteristics caused by the predetermined factor using the at least one selected technique in the second step, wherein the second technique is selected in the second step when the change amount of the predetermined image formation characteristics determined in the first step is generated in a predetermined period of time.

32. The exposure method according to claim 31, wherein the predetermined period of time is a period for processing one lot.

33. A projection exposure apparatus comprising an illumination optical system which illuminates a mask pattern by an illumination light and a projection optical system which projects an image of the mask pattern onto a substrate, the projection exposure apparatus comprising:

a measurement device which determines information on a change amount of predetermined image formation characteristics of the projection optical system caused by a predetermined factor;

a first image formation characteristics adjustment system which is electrically connected to the measurement device and adjusts the predetermined image formation characteristics by a first technique for changing a wavelength of the illumination light; and a second image formation characteristics adjustment system which is electrically connected to the measurement device and adjusts the predetermined image formation characteristics by a second technique which is different from the first technique, wherein:

the projection exposure apparatus selects at least one of the first image formation characteristics adjustment system and the second image formation characteristics adjustment system, and corrects the change amount of the predetermined image formation characteristics caused by the predetermined factor using the at least one selected image formation characteristics adjustment system; and the projection exposure apparatus selects the second image formation characteristics adjustment system in case that the change amount of the predetermined image formation characteristics determined by the measurement device is generated in a predetermined period of time.

* * * * *